(12) United States Patent
Salcedo et al.

(10) Patent No.: US 7,985,640 B2
(45) Date of Patent: Jul. 26, 2011

(54) DEVICES WITH ADJUSTABLE DUAL-POLARITY TRIGGER-AND HOLDING-VOLTAGE/CURRENT FOR HIGH LEVEL OF ELECTROSTATIC DISCHARGE PROTECTION IN SUB-MICRON MIXED SIGNAL CMOS/BICMOS INTEGRATED

(75) Inventors: Javier A. Salcedo, Orlando, FL (US); Juin J. Liou, Oviedo, FL (US); Joseph C. Bernier, Palm Bay, FL (US); Donald K. Whitney, West Melbourne, FL (US)

(73) Assignees: Intersil Americas, Inc., Milpitas, CA (US); University of Central Florida, Orlando, FL (US)

( * ) Notice: Subject to any disclaimer, the term of this patent is extended or adjusted under 35 U.S.C. 154(b) by 54 days.

(21) Appl. No.: 12/420,264

(22) Filed: Apr. 8, 2009

(65) Prior Publication Data
US 2009/0261378 A1 Oct. 22, 2009

Related U.S. Application Data

(62) Division of application No. 11/289,390, filed on Nov. 30, 2005, now Pat. No. 7,566,914.

(60) Provisional application No. 60/696,794, filed on Jul. 7, 2005.

(51) Int. Cl.
*H01L 21/8238* (2006.01)
*H01L 21/82* (2006.01)
*H01L 21/00* (2006.01)
*H01L 21/84* (2006.01)

(52) U.S. Cl. ......... 438/199; 438/128; 438/154; 438/200

(58) Field of Classification Search .................. 438/199, 438/223, 224, 227, 228, 128–129, 200, 217, 438/152, 155, 156, 309, 311, 153, 154, 325, 438/202, 234, 163
See application file for complete search history.

(56) References Cited

U.S. PATENT DOCUMENTS
4,400,711 A 8/1983 Avery
(Continued)

OTHER PUBLICATIONS

Temple, "MOS-Controlled Thyristor—A New Class of Power Device," IEEE Transactions on Electron Devices, vol. Ed-33, No. 10, Oct. 1986, p. 1609.
(Continued)

*Primary Examiner* — Chuong A. Luu
(74) *Attorney, Agent, or Firm* — MH2 Technology Law Group LLP

(57) ABSTRACT

Symmetrical/asymmetrical bidirectional S-shaped I-V characteristics with trigger voltages ranging from 10 V to over 40 V and relatively high holding current are obtained for advanced sub-micron silicided CMOS (Complementary Metal Oxide Semiconductor)/BiCMOS (Bipolar CMOS) technologies by custom implementation of $P_1$-$N_2$-$P_2$-$N_1$//$N_1$-$P_3$-$N_3$-$P_1$ lateral structures with embedded ballast resistance 58, 58A, 56, 56A and periphery guard-ring isolation 88-86. The bidirectional protection devices render a high level of electrostatic discharge (ESD) immunity for advanced CMOS/BiCMOS processes with no latchup problems. Novel design-adapted multifinger 354/interdigitated 336 layout schemes of the ESD protection cells allow for scaling-up the ESD performance of the protection structure and custom integration, while the I-V characteristics 480 are adjustable to the operating conditions of the integrated circuit (IC). The ESD protection cells are tested using the TLP (Transmission Line Pulse) technique, and ESD standards including HBM (Human Body Model), MM (Machine Model), and IEC (International Electrotechnical Commission) IEC 1000-4-2_standard for ESD immunity. ESD protection performance is demonstrated also at high temperature (140° C.). The unique high ratio of dual-polarity ESD protection level per unit area, allows for integration of fast-response and compact protection cells optimized for the current tendency of the semiconductor industry toward low cost and high density-oriented IC design. Symmetric/asymmetric dual polarity ESD protection performance is demonstrated for over 15 kV HBM, 2 kV MM, and 16.5 kV IEC for sub-micron technology.

8 Claims, 37 Drawing Sheets

U.S. PATENT DOCUMENTS

| | | |
|---|---|---|
| 4,484,244 A | 11/1984 | Avery |
| 4,567,500 A | 1/1986 | Avery |
| 4,595,941 A | 6/1986 | Avery |
| 4,622,568 A | 11/1986 | Schutten et al. |
| 4,750,078 A | 6/1988 | Ganger et al. |
| 4,839,768 A | 6/1989 | Daniel et al. |
| 5,032,742 A | 7/1991 | Zanders |
| 5,343,053 A | 8/1994 | Avery |
| 5,369,041 A | 11/1994 | Duvvury |
| 5,453,384 A | 9/1995 | Chatterjee |
| 5,455,436 A | 10/1995 | Cheng |
| 5,670,799 A | 9/1997 | Croft |
| 5,708,550 A | 1/1998 | Avery |
| 5,856,214 A | 1/1999 | Yu |
| 5,872,379 A | 2/1999 | Lee |
| 5,932,918 A | 8/1999 | Krakauer |
| 5,945,713 A | 8/1999 | Voldman |
| 6,081,002 A | 6/2000 | Amerasekera et al. |
| 6,365,924 B1 | 4/2002 | Wang et al. |
| 6,414,830 B1 | 7/2002 | Yu |
| 6,433,979 B1 | 8/2002 | Yu |
| 6,465,283 B1 * | 10/2002 | Chang et al. ............ 438/135 |
| 6,465,848 B2 | 10/2002 | Ker et al. |
| 6,566,715 B1 | 5/2003 | Ker et al. |
| 6,583,972 B2 | 6/2003 | Verhaege et al. |
| 6,594,132 B1 | 7/2003 | Avery |
| 6,914,271 B2 | 7/2005 | Menard |
| 6,979,850 B2 * | 12/2005 | Hatade ..................... 257/296 |
| 7,408,228 B2 | 8/2008 | Hatade et al. |

OTHER PUBLICATIONS

Amerasekera at al., "The Impact of Technology Scaling on ESD Robustness and Protection Circuit Design," IEEE Transactions on Components, Packaging, and Manufacturing Technology—Part A, vol. 18, No. 2, Jun. 1995, p. 314.

Voldman, "A Review of latchup and electrostatic discharge (ESD) in BiCMOS RF silicon germanium technologies: Part I—ESD," Microelectronics Reliability, 45, 2005, p. 323.

Wang et al., "On a Dual-Polarity On-Chip Electrostatic Discharge Protection Structure," IEEE Transactions on Electron Devices, vol. 48, No. 5, May 2001, p. 978.

* cited by examiner

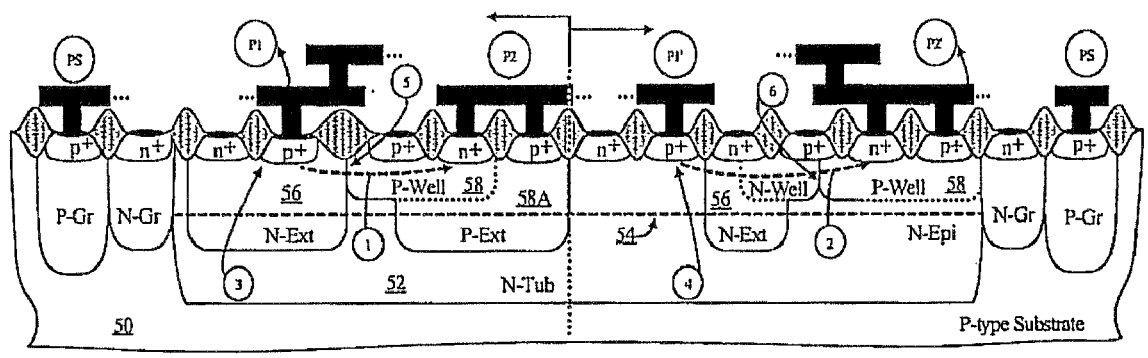
*FIG. 2*
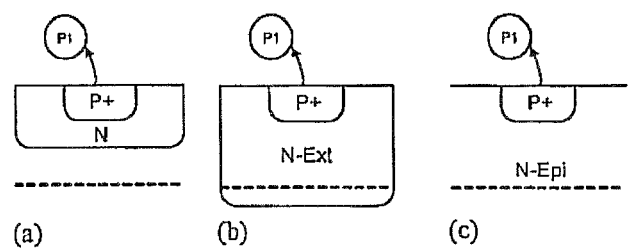
*FIG. 3(a)-(c)*

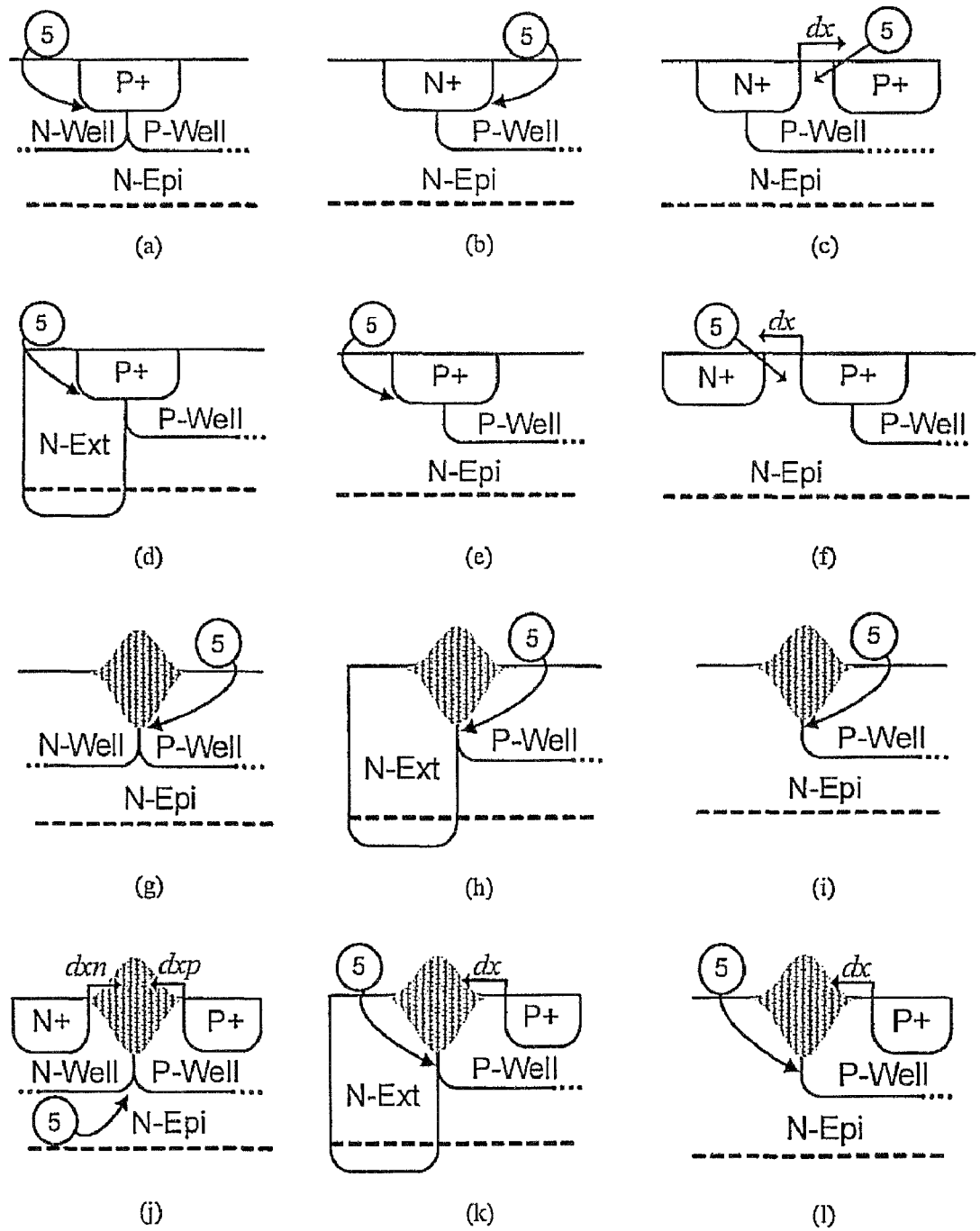
*FIG. 4(a)-(l)*

*FIG. 21A*
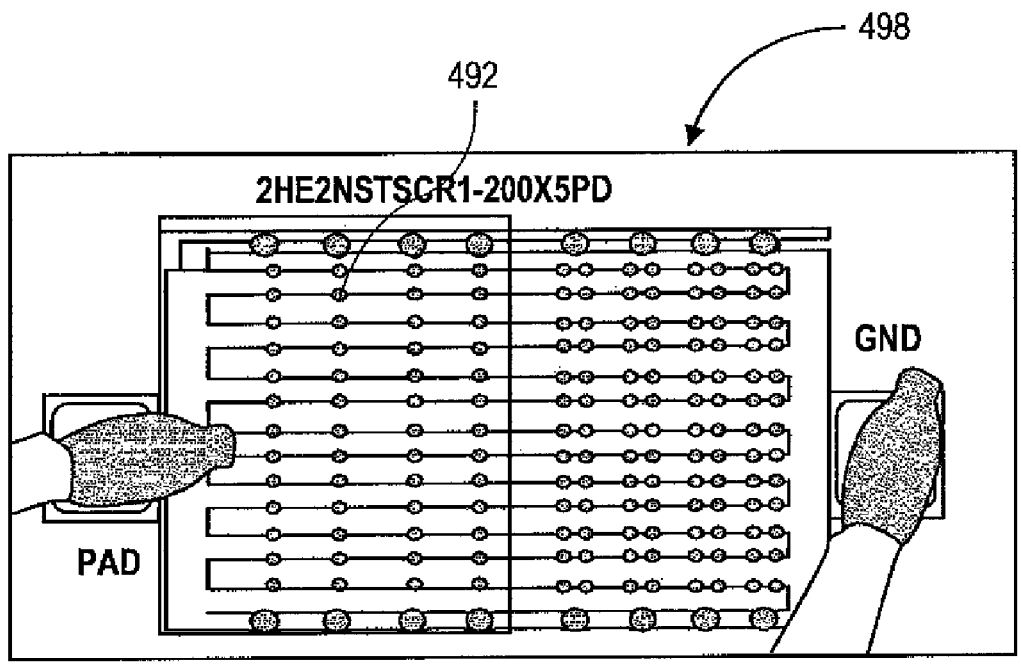
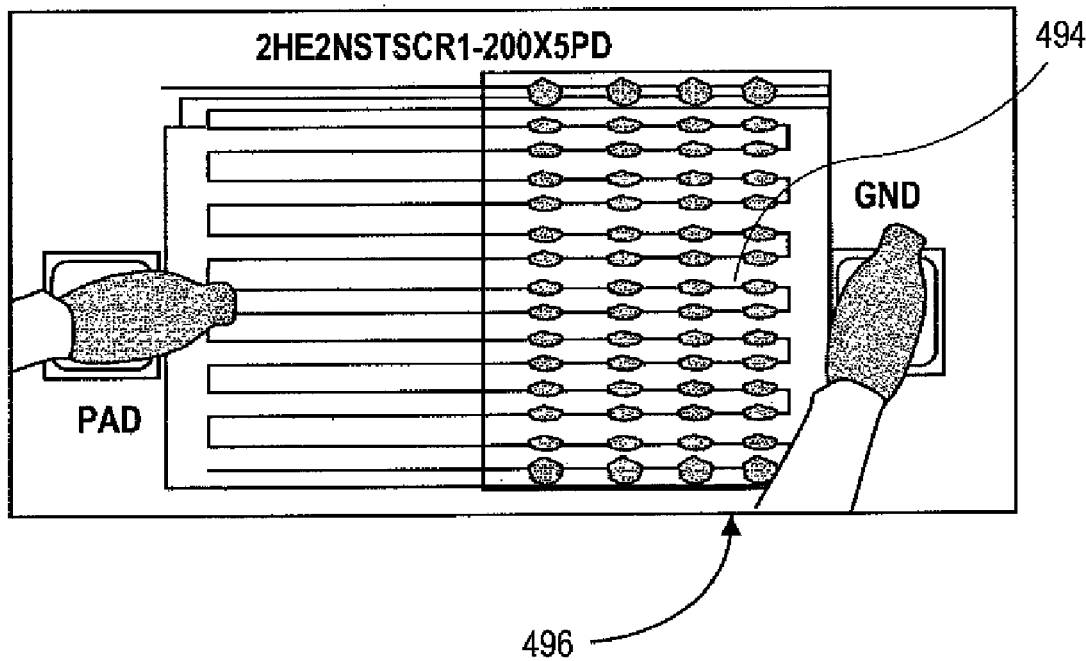
*FIG. 21B*

DEVICES WITH ADJUSTABLE DUAL-POLARITY TRIGGER-AND HOLDING-VOLTAGE/CURRENT FOR HIGH LEVEL OF ELECTROSTATIC DISCHARGE PROTECTION IN SUB-MICRON MIXED SIGNAL CMOS/BICMOS INTEGRATED

CROSS-REFERENCE TO RELATED APPLICATIONS

This application is a divisional application of U.S. patent application Ser. No. 11/289,390 filed on Nov. 30, 2005 which claims priority to U.S. Provisional Patent Application Ser. No. 60/696,794 filed on Jul. 7, 2005, the disclosure of which is incorporated by reference in its entirety.

FIELD OF THE INVENTION

The subject matter of this application relates to semiconductor integrated circuits. More particularly, the subject of this application relates to Electrostatic Discharge (ESD) protection in Complementary Metal Oxide Semiconductor (CMOS) or Bipolar CMOS (BiCMOS) mixed-signal integrated circuits (ICs) operating at Input/Output (I/O) voltages well above/below the native power supply voltage.

BACKGROUND OF THE INVENTION

The occurrence of high voltage spikes, namely electrostatic discharge (ESD), induced by uncontrollable charge imbalance between a chip's input or output pads and externally grounded or pre-charged objects, affects the reliability and functionality of semiconductor integrated circuits (ICs), commonly resulting in hard-failure for advanced technologies. Various protection techniques have been developed to protect circuitry from ESD. Prior techniques have attempted to implement protection to the circuits by using one or more devices to provide current paths between the IC's pins and one or both circuit voltage supplies to shunt the current of unpredictable and destructive signals. Such ESD protection is required to be transparent during the normal operation of the circuit, so that the ESD protection does not negatively impact the performance of the remaining IC circuitry. A major problem, however, is that current devices for advanced silicided CMOS/BiCMOS technologies for high level of ESD protection purpose are unavailable. Further, standard devices, optimized for performance not for power, are ineffective in handling the high power obtained during an ESD event.

The shrinking of device dimensions in advanced technologies, aimed at both high performance and high density circuits, often results in ICs that are more sensitive to ESD events. This consequence of the driving technology downscaling is mainly associated with different tradeoffs that improve performance by decreasing the power handling capability. The reduction of core circuit and ESD protection area involving shallow junctions, low junction breakdown voltage, thin gate oxide, low bias operating voltage, high circuit density, mixed-voltage interface environments, packaging constraints, and rigid layout design rules, is discussed by Voldman, "A review of latchup and electrostatic discharge (ESD) in BiCMOS silicon germanium technologies: Part I ESD", *Microelectronics Reliability*, pp. 323-340, 2005.

To provide the necessary ESD protection, standard devices for on-chip ESD protection can occupy a considerable area of the IC, as discussed in the article by Amerasekera et al., "The impact of technology scaling on ESD robustness and protection circuit design", *IEEE Transaction on Components, Packaging, and Manufacturing Technology-Part A*, pp. 314-320, 1995 Moreover, increasing the size of the traditional protection structures to levels comparable with the core circuit dimensions does not guarantee that the ESD protection requirements are reached. This condition can degrade the ESD performance in sub-micron mixed-signal ICs and diminish the potential advantages of the technology downscaling.

ESD protection devices designed to undergo in high conductivity modulation upon activation, overcome the limitations of standard ESD protection structures. These kinds of devices can be realized by properly combining opposite doping concentration types, P (free holes are majority) and N (free electrons are majority), in (P-N)-(P-N) double injection lateral structures, namely thyristor or SCR (silicon controlled rectifier) type devices.

FIG. 1A shows a cross sectional view of the SCR in the prior art. The anode 24 and cathode 22 terminals are typically connected to the pad to be protected and one of the power rails. The (P-N)-(P-N) structure is obtained by the layers 12, 14, 18, and 20. FIG. 1B shows a circuital schematic representation of the device shown in FIG. 1A. The schematic shows the SCR consisting of two coupled BJTs, pnp 26 and npn 28, and two resistors, one associated with the N-well 30 and the second associated with the P-type substrate 32, corresponding to the electrodes 16 and 10, respectively. This device maintains the high-impedance off-state while the anode-cathode voltage is higher than the reference voltage in the cathode but lower than the so called trigger voltage, which is the voltage where the device reaches the on-state condition. For anode-cathode voltage below zero, conduction is obtained at a forward biased junction. The SCR device was originally built in custom technologies and studied in the prior art for high power electronics purposes, as discussed, for example in the article by Temple, "MOS Controlled Thyristors—A New Class of Power Devices," *IEEE Trans. Electron Devices*, vol. ED-33, pp. 1609-1618, 1986.

Some approaches have attempted to design thyristor-type devices to provide ESD protection. The use of SCRs as input protection for early processes is shown in U.S. Pat. Nos. 4,400,711; 4,484,244; 4,567,500; and 4,595,941. In these patents, SCR-type structures were designed using the given process for protection from the PAD to $V_{SS}$ (reference voltage power rail) and from the PAD to $V_{DD}$ (high voltage power rail). Disclosed are devices that allow a unidirectional current path from one of the power rails to the pad, or that create a coupled BJT transistor structure able to conduct high current when the voltage transients exceed the predetermined values (either negative or positive) from the pad to the power rails. These devices are aimed at clamping the input voltage within the range of the power supply, for instance in circuits for signal processing in early TVs.

A scheme of Schottky barrier diodes address the protection for IC applications which are required to interface with outside circuits operating at higher voltage. In these cases, a diode is connected between the input terminal and the power supply line for blocking voltages from the input terminal which are greater than the power supply voltage. These schemes are designed for an integrated circuit (IC) fabricated using geometries about 0.5 micrometers where the input and bidirectional input/output (I/O) circuits have to withstand an input voltage which can exceed the IC supply voltage. For example, the IC may operate at 3.3 volts, but must have the ability to interface with other circuits having 5 volt logic swings. This ability is commonly called "5 volt friendly." This alternative ESD solution is directed to a very close interface voltage and does not provide a solution for a circuit that should operate at voltage range exceeding three or more times the power supply.

Other schemes proposed the use of SCR structures to provide higher conducting voltage. In these schemes, the trigger and holding voltage are increased by using stacked devices. This solution also involves stringent design of the triggering circuit and normally requires the addition of external triggering circuit components. Moreover, they can be very sensitive to the technology design rules.

Previous art also considers PN junctions stacked in series. In such cases, the protection structure starts conducting at voltages below/above the operating voltage. If the appropriated area is used, the diode structure provides a medium level of ESD protection at voltages lower/higher than the conducting voltage defined by the stacked diodes operating in combine reverse breakdown or Zener condition, and forward conduction. There are several known disadvantages of this system, however. For example, parallel/series clamping diodes require a large area, are slow-response, exhibit undesirable parasitic capacitance and leakage current, and have undesirably high "on" resistance. Also, such large diode clamps require a low impedance return path. Without a low impedance return path, the effectiveness of these large diode clamps is greatly reduced. Additionally, large clamping devices are not standard devices and are not practiced in advanced high density integrated circuits.

Wang et al., "On a dual-polarity on-chip electrostatic discharge protection structure," *IEEE Transaction on Electron Devices*, pp. 978-984, 2001, and U.S. Pat. No. 6,365,924 B1, propose a structure built in a p-type substrate for dual polarity symmetric operating voltages exceeding the power supply. In this structure, variations in the P-base and N-well profiles defined by the process highly affect the trigger voltage that can be obtained. As such, it is limited to only a few processes that provide this flexibility. The electrodes of Wang et al. define two symmetric interconnections, a first to the pad and a second to the reference power rail, which is normally ground. Wang et al. discuss the characteristics of the device in the specific process, and performance and extension of the protection devices are restricted to the specified case of discussion. By symmetry in this device, the main region for injection of minority carriers is the same region for the current path in both polarities. This increases the risk of hot spot generation and non-uniform current distribution when dimensions in the device are increased for higher levels of ESD protection which poses scaling problems. A further limitation of the device is its inability to provide asymmetric dual polarity characteristics and non-uniform operating condition in a parallel device array.

Isolation of the protection devices from the rest of the circuit should also be addressed for dual-polarity protection devices. Customized guard-rings are fundamental components for isolating devices in the circuit, and are important for isolating ESD protection devices that are required to sustain high voltage/high current conditions. Guard ring structures, however, have traditionally constrained the minimum and maximum conducting voltages (below $V_{SS}$ and above $V_{DD}$ power rails) that can be obtained in the devices. U.S. patent application Ser. No. 11/032,154 filed Jan. 11, 2005, and U.S. Provisional Application Ser. No. 60/643,692 filed Jan. 12, 2005, also discuss ESD devices and are incorporated herein by reference in their entirety.

Thus, there is a need to overcome these and other problems of the prior art associated with conventional ESD devices. Further, there is a need for an ESD protection structure that includes isolation from the core circuit and that can provide the ESD protection in emerging, advanced technologies, thereby allowing for migration of semiconductor products that require interface with external circuits that operate at much higher or lower symmetric/asymmetric voltages, or even including high level of ESD immunity requirements.

SUMMARY OF THE INVENTION

In accordance with various embodiments of the invention, there is a new generation of methods, devices, and associated design methodology for protecting integrated circuits (ICs) from damage caused by electrostatic discharge (ESD) in advanced sub-micron CMOS/BiCMOS technologies for applications with input and/or output above and below, by several times, the circuit power supply.

In accordance with various embodiments of the invention, there is a method and a device comprising symmetric or asymmetric dual-polarity ESD protection structures that use layout-adapted $P_1$-$N_2$-$P_2$-$N_1$//$P_1$-$N_3$-$P_3$-$N_1$ lateral protection devices with adjustable I-V characteristic and high current rating capability.

In accordance with various embodiments of the invention, there is a method and a device comprising a multifinger device structure with interleaved ballast resistance and inter-digited metal, optimized for high current distribution, low risk of filamentation that is versatile to adapt to demanding layout rules, and packaging constraints of high density integrated circuits.

In accordance with various embodiments of the invention, there is a method and a device comprising clamps and input/output (I/O) protection devices that do not affect circuit performance, while at the same time giving high conductivity modulation through independent conduction paths that are optimized for ESD current of opposite polarities.

In accordance with various embodiments of the invention, there is a method and a device having a dual polarity ESD protection solution with general characteristics of an S-type I-V curve. The device can be adjusted in both polarities to different requirements in specialized semiconductor products, such as, for example, charge-pump-based applications, electronics equipments interface, LAN (Local area networks) ICs, power management, LCD (Liquid Crystal Display) controls, DC-DC converters, power regulators, and other mixed voltage systems.

In accordance with various embodiments of the invention, there is a method and a device that can maintain guard ring isolation in the ESD protection devices so that parasitics between the ESD protection devices and other components of the core circuit do not interact. These parasitics, for example, SCRs or BJTs, can create leakage current paths or even reach on-state conditions at high voltage/high current ESD events, causing degradation of the system level ESD performance and affecting the functionality of the circuit.

In accordance with various embodiments of the invention, there is a method and a device that can afford the migration of existing products to advanced CMOS/BiCMOS technologies to take further advantage of the technology downscaling tendency, while providing the required level of ESD-induced damage immunity.

In accordance with various embodiments of the invention, there is a method and a device for multi-transmitters/multi-receivers and multi-protocols data communication chips in general, that provide high levels of protection from damage causes by very high levels of positive and negative ESD pulses. According to the invention, this can be achieved by providing dual-polarity ground-referenced ESD protection circuits at the communication pads, protection at the low voltage-low ESD digital pads, and asymmetric dual-polarity protection at every power supply rail on a chip.

According to various embodiments there is provided a semiconductor device and a method of making a semiconductor device. The semiconductor device can comprise a substrate of a first conductivity type and a first section formed in the substrate. The first section comprises a first electrode contacting a first region doped to the first conductivity type a second electrode contacting a second region doped to a second conductivity type, wherein the first region and the second are disposed adjacent to each other, a first forward blocking junction formed in a current path between the first electrode and the second electrode, and a first reverse blocking junction formed in the current path between the second electrode and an edge of the first section.

According to another embodiment, there is provided a semiconductor device and a method of making a semiconductor device. The semiconductor device can comprise a substrate of a first conductivity type and a first section formed in the substrate. The first section can comprise a first electrode contacting a first region doped to the first conductivity type, a second electrode contacting a second region doped to a second conductivity type, wherein the first region and the second region are disposed adjacent to each other. The first section can also comprise a first forward blocking junction formed in a current path between the first electrode and the second electrode and a first reverse blocking junction formed in the current path between the second electrode and an edge of the first section. The semiconductor device can also comprise a second section formed in the substrate. The second section can comprise a third electrode contacting a third region doped to the second conductivity type and a fourth electrode contacting a fourth region doped to the first conductivity type, wherein the third region and the fourth region are disposed adjacent to each other. The second section can also comprise a second forward blocking junction formed in a current path between the third electrode and the fourth electrode and a second reverse blocking junction formed in the current path between the fourth electrode and an edge of the first section.

According to another embodiment there is provided a semiconductor device and a method of making a semiconductor device. The semiconductor device can comprise a substrate and a first section formed in the substrate. The first section can comprise a first forward blocking junction formed in a current path between a first electrode and a second electrode and a first reverse blocking junction formed in a current path between the second electrode and an edge of the first section. The semiconductor device can also comprise a second section formed in the substrate. The second section can comprise a second forward blocking junction formed in a current path between a third electrode and a fourth electrode and a second reverse blocking junction formed in a current path between the third electrode and an edge of the second section, wherein the first electrode is connected to the fourth electrode, and wherein the second electrode is connected to the third electrode.

According to another embodiment there is provided a semiconductor device and a method of making a semiconductor device The semiconductor device can comprise a substrate, a first power rail connected to one of a ground or a negative voltage ($V_S$), a second power rail connected to a circuit ground ($V_{SS}$), and a third power rail connected to positive voltage ($V_{DD}$). The semiconductor device can also comprise two sub-sections. A first sub-section formed in the substrate, the first sub-section comprising a first forward blocking junction formed in a current path between a first electrode and a second electrode, a first reverse blocking junction formed in a current path between the second electrode and an edge of the first section. A second sub-section formed in the substrate, the second sub-section comprising a second forward blocking junction formed in a current path between a third electrode and a fourth electrode, a second reverse blocking junction formed in a current path between the fourth electrode and an edge of the first sub-section. An input/output pad connected to the first- and fourth-electrode, while the second- and third-electrode connected to either power rail, wherein the first forward blocking and second reverse blocking junction block conduction from the input/output pad to the reference rail, and the second forward blocking and first reverse blocking junction block conduction from the reference rail to the input/output pad. The input/output having ESD protection and no conduction throughout the two-section semiconductor device at a predetermine operating condition, even when the operating voltage on the input/output pad raises above ($V_{DD}$) or below ($V_S$ or $V_{SS}$).

It can be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE DRAWINGS

FIG. 2 shows a cross sectional-view of a dual polarity ESD device according to various embodiments of the invention. The device shown in FIG. 2 is a bidirectional device with no intermediate guard-ring separation;

FIGS. 3(a)-(c) depict schematic representations of different junction configurations for adjusting the reverse breakdown voltage $V_R$;

FIGS. 4(a)-(l) depict schematic representations of junction configurations, comprising an intermediate single highly doped well, or an intermediate single isolation, or an intermediate dual highly doped well, for adjusting the forward trigger voltage $V_T$;

FIGS. 21A and 21B are Emission Microscopy (EMMI) images of the optical beam induced current (OBIC) showing uniform finger conduction for positive and negative ESD current applied in a 35 V DP-STT according to an embodiment of the invention;

Figure 1A:
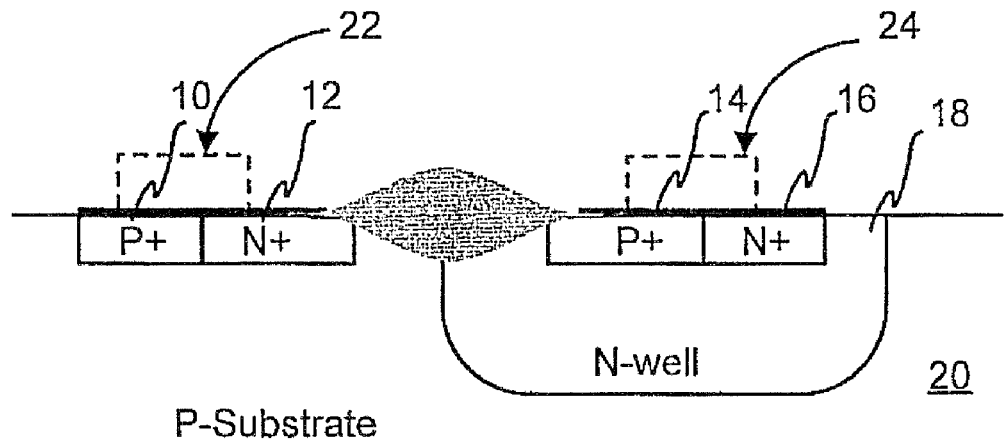
FIG. 1A shows a cross-sectional view of a SCR in the prior art.
Figure 1B:
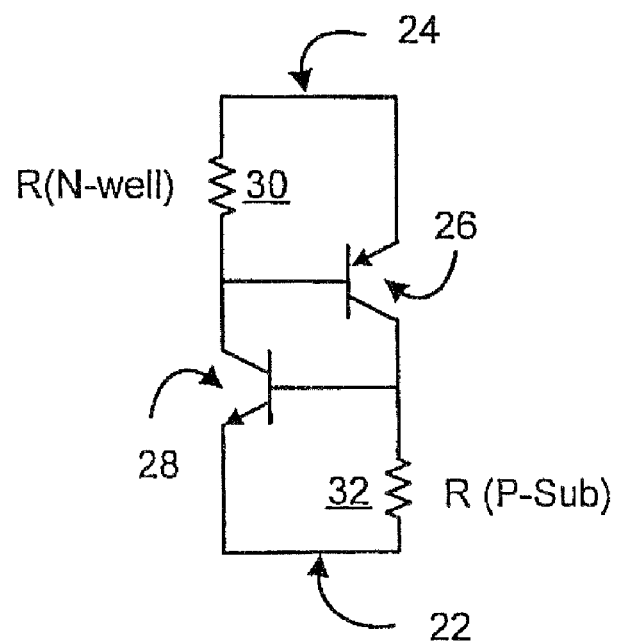
FIG. 1B shows a circuit schematic of the lateral SCR in the prior art.
Figure 1C:
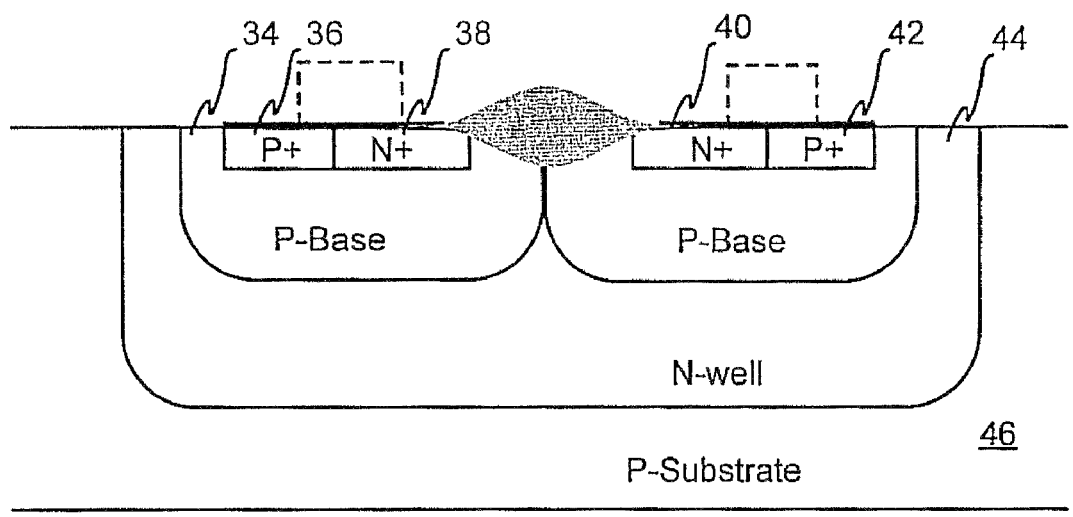
FIG. 1C shows the structure of a N-P-N-P-N ESD protection in the prior art.

TABLE 1 summarizes the conducting voltage characteristics and ESD performance for 5 fingers DP-STT devices in FIGS. 14, 17, 19, and 22;

TABLES 2A and 2B summarize the internal lateral dimensions for specific n- and p-type MSSTTs, respectively. The corresponding TLP I-V characteristics obtained for four of these devices 250 μm-width are depicted in FIGS. 10A and 10B, 11A and 11B, respectively; and TABLES 3A and 3B summarize the internal lateral dimensions of different n- and p-type MDSTTs. The corresponding TLP I-V characteristics obtained for four of these devices 250 μm-width are depicted in FIGS. 12A and 12B, 13A and 13B, respectively.

DESCRIPTION OF THE EMBODIMENTS

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, not to be taken in a limited sense.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

The devices disclosed herein can protect a core circuit from damage caused from ESD stress in a broad range of applications where the IC may be subject to a hostile environment and the interface I/O signal is bipolar and below/above the range of the core circuit power supply. Some examples of where this can be an issue can include data communication transceivers used in most advanced domestic electronic equipment, industrial control devices, distributive medical communication and monitoring, equipment for local area networks (LANs), and for closed circuit security systems. Further applications can also include embedded DC-DC converters, power management, and in general, any charge pump-based IC. These applications form an important sector of the semiconductor industry that highly influences the development of advanced technology for fundamental activities and high quality life.

The bidirectional operational devices for the design of input/output ESD protection can be considered in complementary versions, namely n- and p-type, which allows for optimum and application/technology-adapted ESD protection characteristics. Various embodiments will be referred hereafter as DP-MSTT (dual polarity modified substrate triggered thyristor) According to various embodiments devices can be formed by basic sub-cells, namely: 1) n- and p-type modified single-substrate-triggered-thyristor (n- and p-type MSSTT), and 2) n- and p-type modified double-substrate-triggered thyristor (n- and p-type MDSTT). According to various embodiments, there is provided a versatile, space-efficient and reliable ESD protection device for a more robust implementation of ESD protection systems in advanced sub-micron CMOS technologies operating at high I/O voltage, much above/below the native operating voltage of the core circuit.

FIGS. 2-26 depict exemplary methods and devices, including test results wherefrom, for use in ESD protection circuits. Turning to FIG. 2 there is a cross-sectional view of a dual polarity ESD protection device according to various embodiments of the invention. The structure comprises two sections (as indicated with the arrows in FIG. 2): a right section for discharging ESD current from the pad to the power rail, shown on the right hand side of FIG. 2 and a left section for discharging ESD current from the power rail to the pad, shown on the left hand side of FIG. 2. Even though the structure allows for the design of each section independently, interaction between the conducting characteristics of the opposite sections can affect the device performance.

In FIG. 2 the current paths during the ESD conduction are labeled with the numbers 1 and 2, the four key p/n junctions are labeled with numbers 3 through 6, and five key terminals are labeled with P1, P2, P1' P2', and PS (guard ring). Considering the case of ground-referenced I/O pad protection, P1, P2', and PS are connected together to form an electrode and grounded, and the second electrode connected to the pad can be formed by connecting P2 and P1' together. For this connection scheme, bidirectional I-V characteristics, from the pad to ground and vice versa, with symmetry and asymmetry can be obtained.

The first step for custom designing the symmetrical or asymmetrical I-V characteristics involves adjusting the forward trigger and reverse breakdown conditions in each section of the device. Using the left section for illustrative purposes, (it is to be noted that the same concepts can apply to the right section) the device can be designed to yield different reverse breakdown voltages $V_R$ and forward trigger voltages $V_T$. The junction labeled 3 can define the blocking voltage BVCEO, or the reverse breakdown voltage $V_R$, for the two open-base parasitic BJTs, one formed between the guard ring PS and P1 and the other between P2 and P1. FIGS. 3(a)-(c) depict three exemplary reverse blocking junction types. The reverse blocking junction can be formed in a current path between an electrode and edge of the section in which it is formed, or between an electrode and the guard ring. Different doping densities on both sides of the different junction types give rise to different critical electric field and impact ionization effects. The reverse blocking junction type shown in FIG. 3(a) yields the smallest $V_R$, followed by the reverse blocking junction type shown in FIG. 3(b), with the reverse blocking junction type shown in FIG. 3(c) yielding the largest $V_R$, among the three.

The junction labeled number 5 in FIG. 2 controls the forward trigger voltage $V_T$, as the breakdown of this junction is the main mechanism that defines the triggering of the regenerative feedback in the device. FIGS. 4(a)-(l) show twelve alternative forward blocking junction configurations that can be used to control trigger voltage $V_T$. The forward blocking junctions shown in FIGS. 4(a)-(l) can comprise a sub-region at a junction between adjacent regions. According to various embodiments, the sub-region can be a doped region, doped to either conductivity, or an isolation area, such as a LOCOS region, shallow trench isolation area, or other isolation areas as will be known to one of ordinary skill in the art. According to various embodiments, the adjacent regions can comprise any of a portion of the tub layer in which the junction is formed, an extension region (Ext) formed in the tub layer, and/or a well region (Well) formed in the tub layer. The forward blocking junction can also be formed in a current path between two electrodes.

Figure 4M:
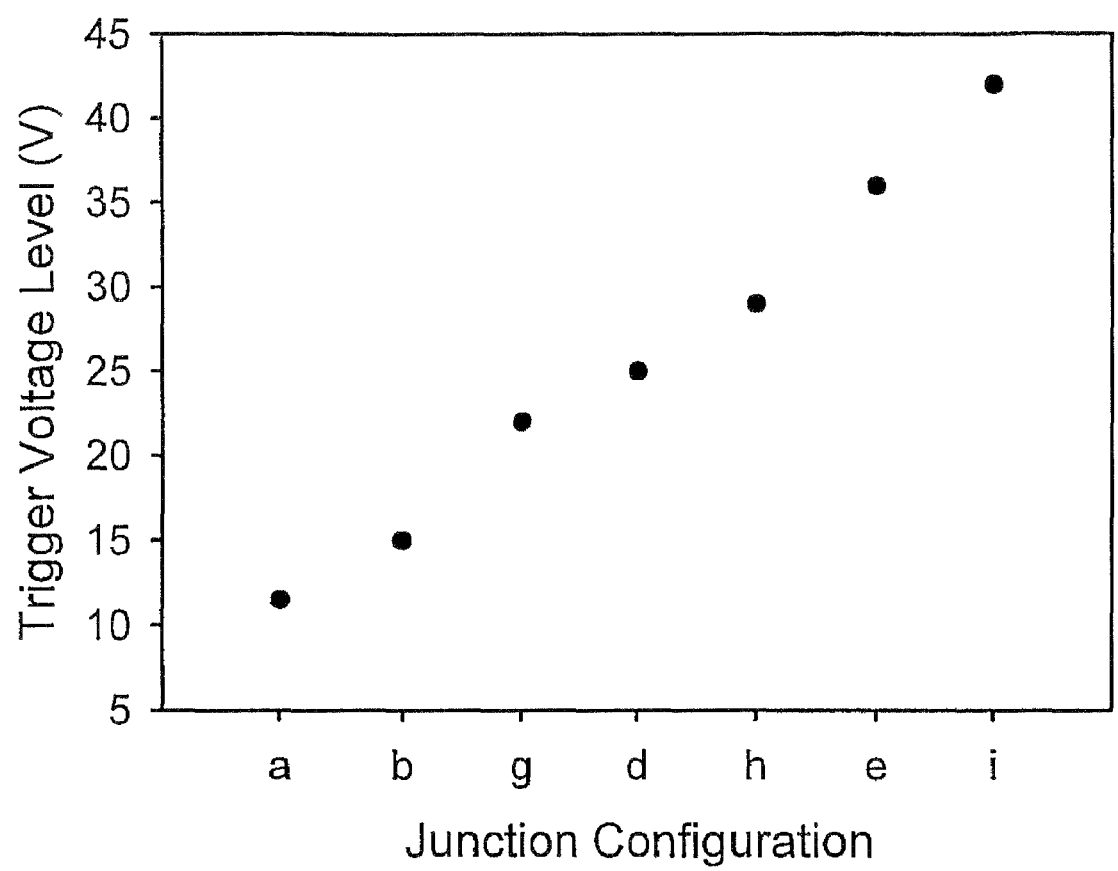
FIG. 4(m) shows the level of the trigger voltage for the junction configurations in FIG. 4(a)-(l)

These forward blocking junction configurations allow for custom design of the trigger voltage for a broad range of IC applications such as, for example, the $V_T$ levels obtained for some of the junction configurations in FIG. 4(m). Furthermore, adjustment of the distance between highly doped regions close to the blocking junction (i.e., distances: dx, dxn, and dxp, for configurations in FIGS. 4(c), 4(f), 4(j), 4(k), and 4(l)) to a predetermined distance modifies the device behavior. For instance, $V_T$ is changed from about 6.5 V to 12.5 V when configuration in FIG. 4(c) is used and dx is increased from 0.2 μm to 0.7 μm. Results from 2-D device simulations provide the following quantitative results close to the corresponding trigger voltages. For dx=0.2 μm, the critical electric field and peak of Selverherr's impact generation rate in the blocking junction are $7 \times 10^5$ V/cm and $1 \times 10^{28} s^{-1} \cdot cm^{-3}$, respectively. However, for dx=0.7 μm, the critical electric field of $6.5 \times 10^5$ V/cm and the peak Selverherr's impact generation rate of $2.5 \times 10^{27} s^{-1} \cdot cm^{-3}$ are obtained. As a result, this design strategy allows for fine adjustment at different intermediate trigger voltages.

The forward blocking junction configurations in FIGS. 4(a), 4(b), 4(d), and 4(e) also have the properties of increasing the intrinsic breakdown voltage of the corresponding blocking junctions, e.g., the breakdown voltage of the p-well diode (i.e., N+ to P-Well) will increase by using the junction configuration 4(b), or for the case of the n-well diode (i.e., N-Well to P+) the breakdown voltage will increase by using the configuration 4(a). A graphical reference of the typical ion-implantation doping profiles combinations considered in the calibration of CAD (Computer Aided Design) simulations are shown in FIGS. 4(n)-4(r). This graphical representation compares different combinations of n- and p-type doping profiles and shows the ESD design flexibility that can be obtained without changes in the based-line of the CMOS or BiCMOS processes.

Figure 4N:
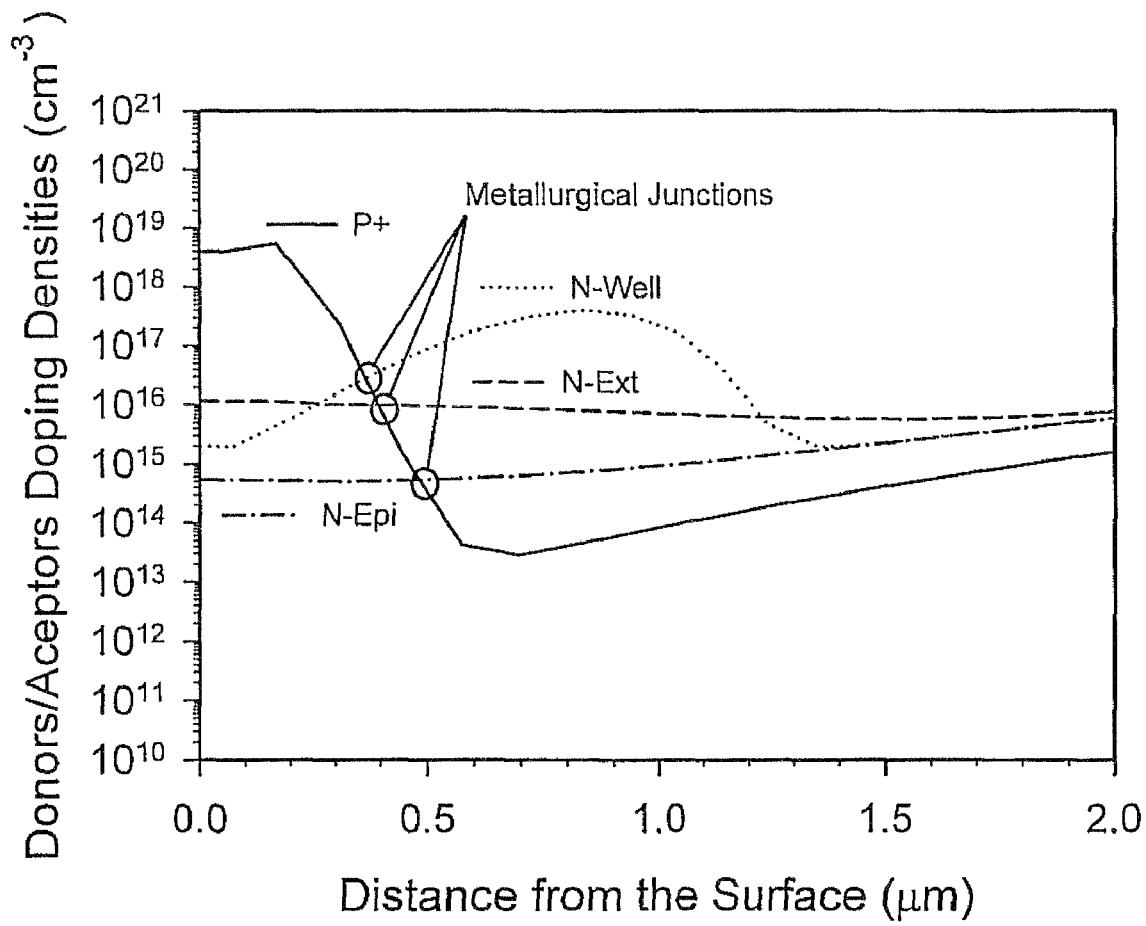
FIG. 4(n) compares the magnitude of the P+/N-Well, P+/N-Ext, and P+/N-Epi doping profiles and indicates the corresponding metallurgical junctions form for each of these doping combinations.
Figure 4O:
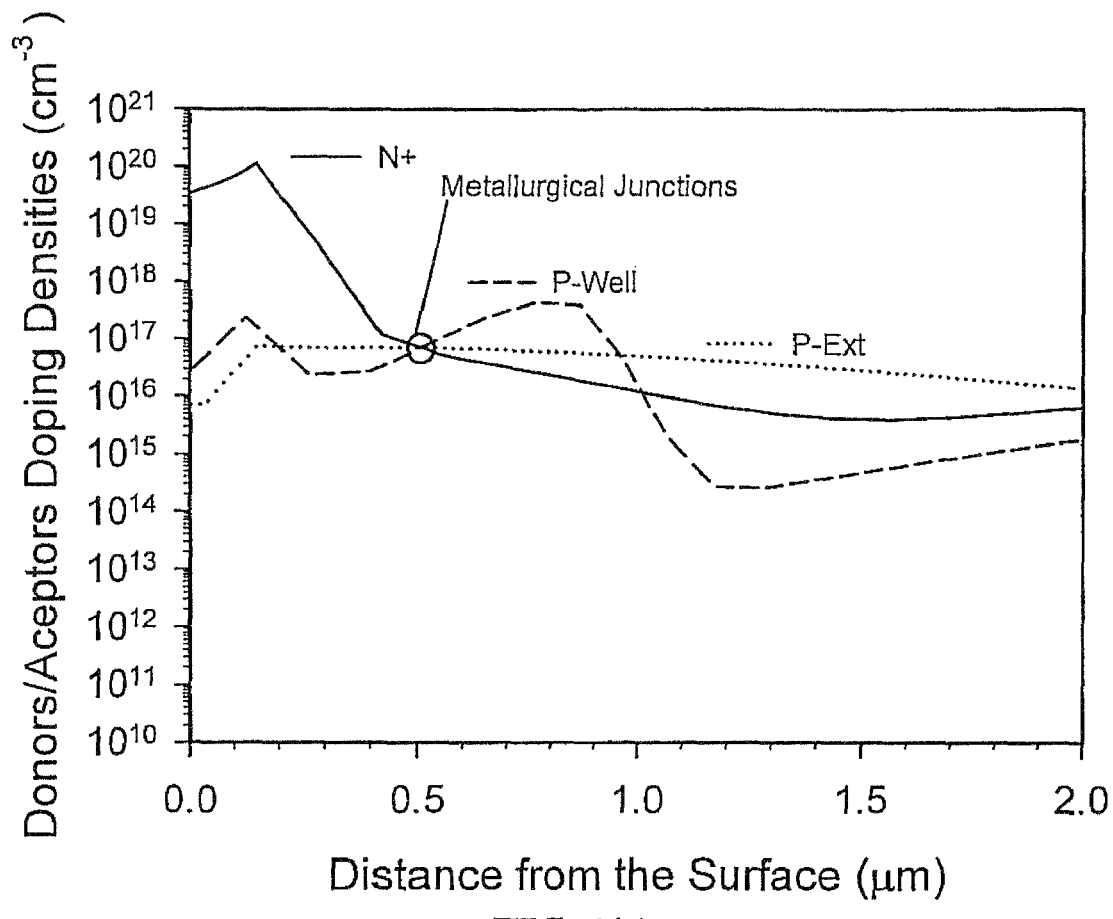
FIG. 4(o) compares the magnitude of the N+/P-Well and N+/P-Ext doping profiles and indicates the corresponding metallurgical junctions.
Figure 4P:
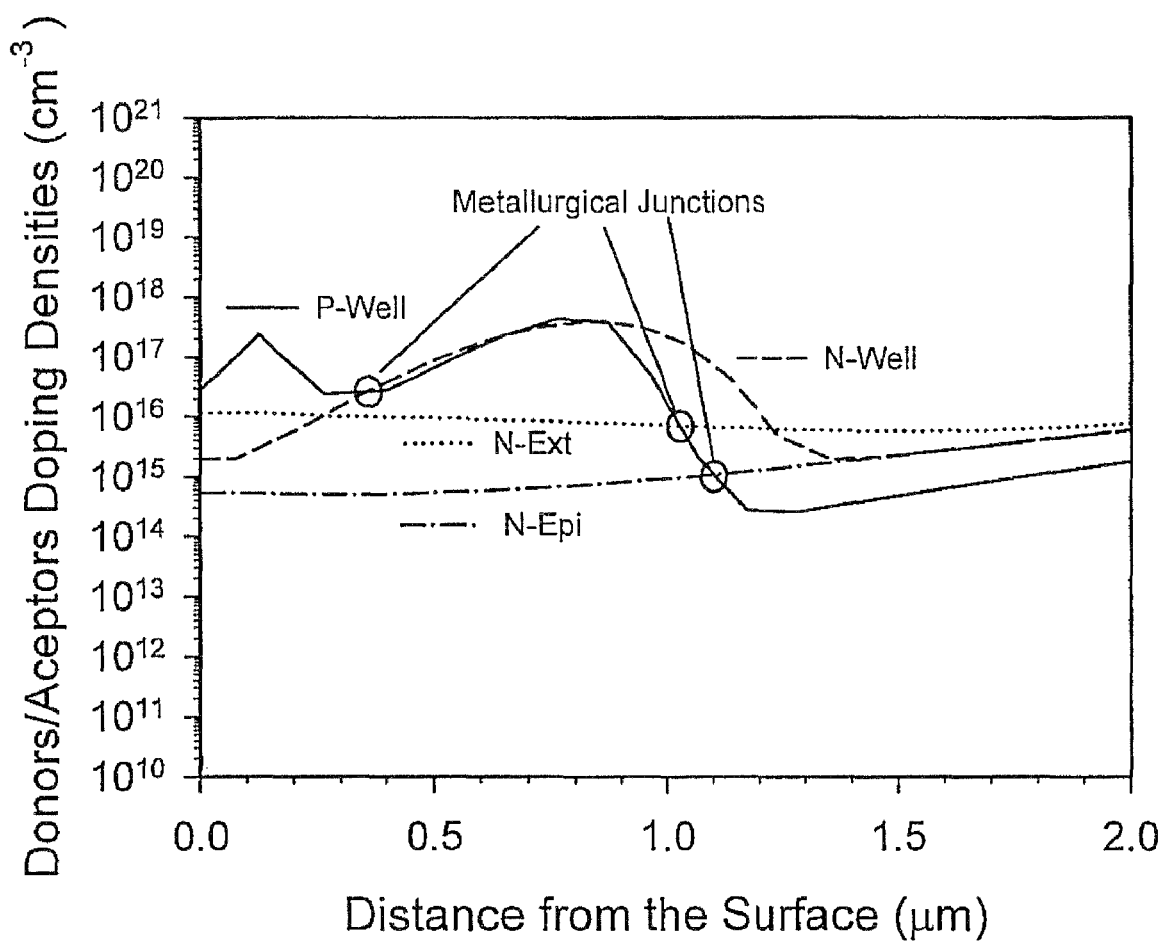
FIG. 4(p) compares the magnitude of the P-Well/N-Well, P-Well/N-Ext and P-Well/N-Epi doping profiles and indicates the corresponding metallurgical junctions.
Figure 4Q:
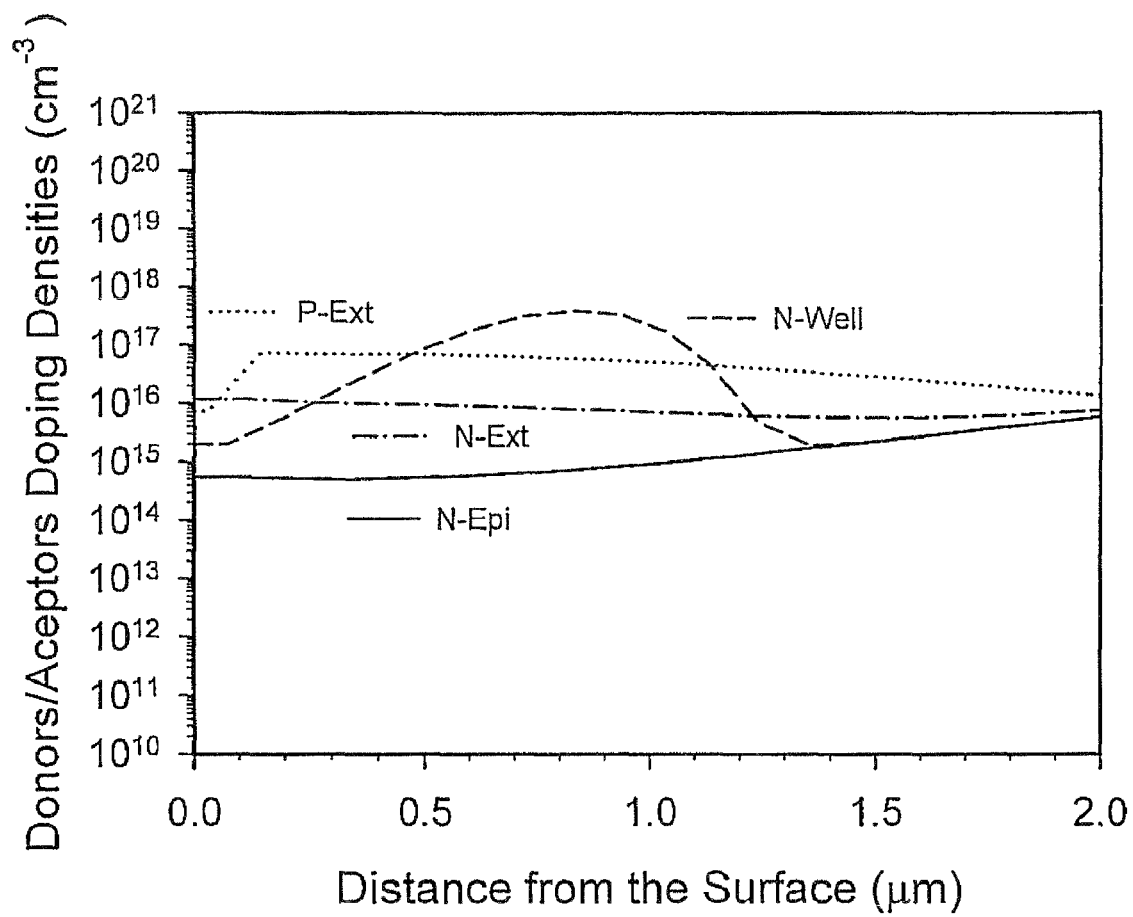
FIG. 4(q) compares the magnitude of the P-Ext with the magnitude of the N-Well, N-Ext and N-Epi.
Figure 4R:
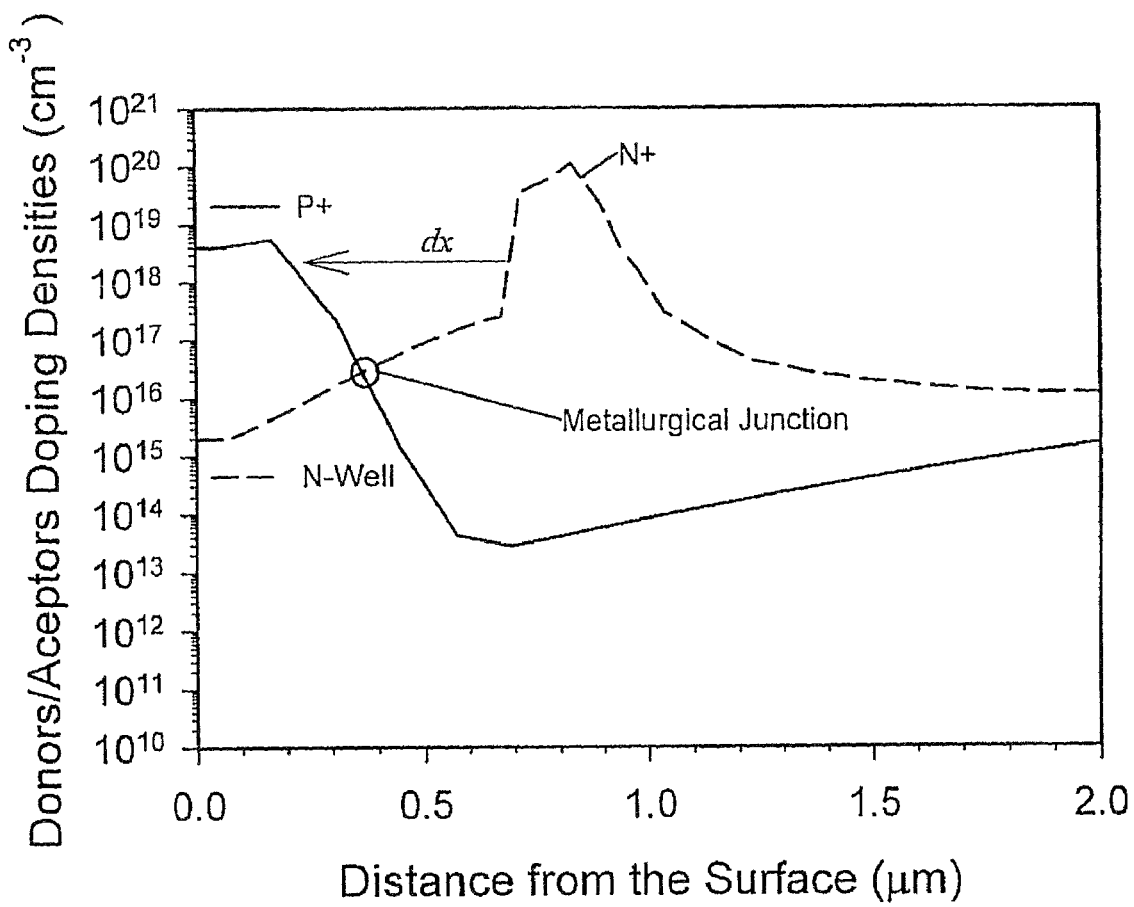
FIG. 4(r) shows a P+/N-Well/N+ exemplary doping profile embodiment used to control the breakdown voltage and associated trigger voltage obtained with the P+/N-Well blocking junction.

FIG. 4(n) shows the doping levels for the P+, and it is compared on the same plot with the corresponding doping levels for the N-Epi, N-Ext, and N-Well regions. The different shapes at the metallurgical junctions give rise to various breakdown- or associated trigger-voltages. FIG. 4(o) shows the opposite case where the N+ is combined with the p-type lightly doped regions. In this condition, associate trigger voltages are different to the one that can be obtained with the configurations in FIG. 4(n). FIGS. 4(p) and 4(q) compare the P-Well and P-Ext with the corresponding lightly doped n-type regions, which are the configurations that can allow for the design of the higher trigger voltages. Note that for the particular example presented in FIG. 4(q), the associated junctions are obtained far away from the surface. For this reason the P-Ext is not considered in the blocking junction configurations. FIG. 4(r) shows the case where the distance between two highly doped regions of opposite type (P+ and N+) are separated by a predetermined distance dx, corresponding to a lightly doped region (N-Well). This approach allows for lower breakdown voltage that the one obtained between the N-Well to the P+ when the distance dx is reduced. This design strategy is followed in FIGS. 4(c), 4(f), 4(j), 4(k), and 4(l).

Figure 5A:
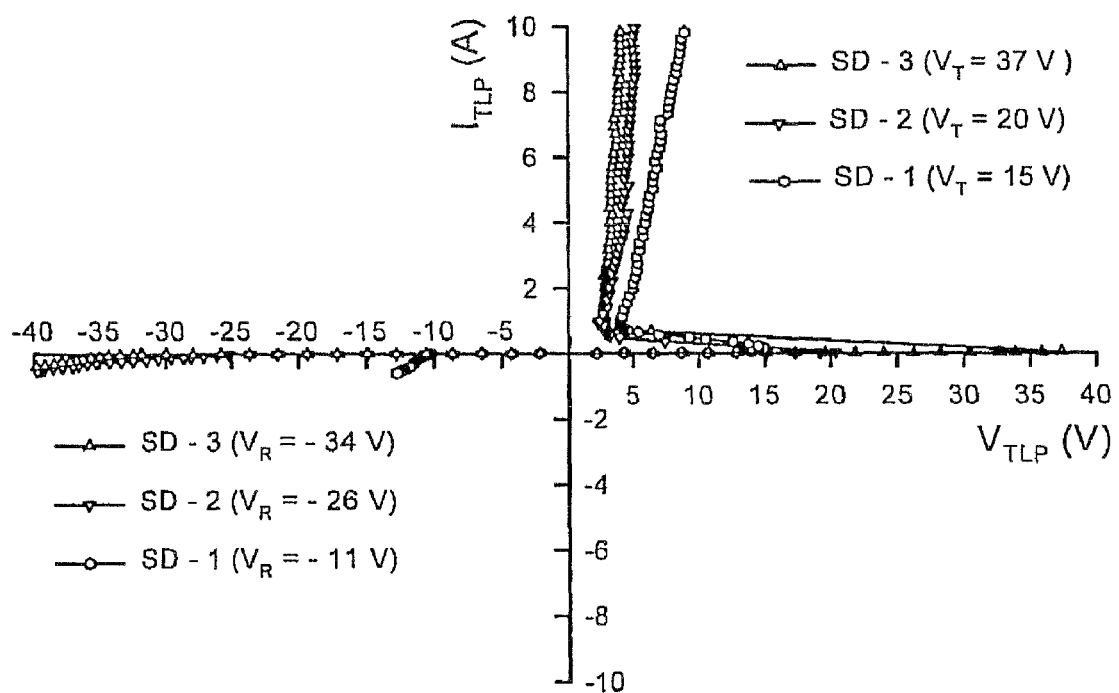
FIGS. 5(a)-(b) compare the forward and reverse conduction characteristics for single-section devices and two-section devices, respectively, using the device in FIG. 2 and different combinations of the junction configurations shown in FIGS. 3(a)-(c) and FIGS. 4(a)-(l)

FIG. 5(a) shows the Transmission Line Pulsed (TLP) I-V characteristics of three single-section devices (SD-1, SD-2, and SD-3) fabricated in a sub-micron, silicided, triple-well CMOS technology and using the following three junction combinations: First, for SD-1, the junction type shown in FIG. 3(a) was used for the junction labeled 3 in FIG. 2 and the junction type shown in FIG. 4(b) was used for the junction labeled 5 in FIG. 2. Second, for SD-2, the junction type shown in FIG. 3(b) was used for the junction label 3 in FIG. 2 and the junction type shown in FIG. 4(d) was used for the junction labeled 5 in FIG. 2. And third, for SD-3, the junction type shown in FIG. 3(c) was used for the junction type labeled 3 in FIG. 2 and the junction type shown in FIG. 4(e) was used for the junction labeled 5 in FIG. 2. Testing on packaged devices using an industry standard TLP instrument, which provides square pulses 100 ns wide and variable rise times of 200 ps, 2 ns and 10 ns are shown herein. As can be seen in FIG. 5(a), three different $V_R$, $V_T$, and conduction current capabilities are obtained. The procedure to substitute the different junction configurations is developed using analog procedures, and in general can be customized to the specific ESD requirements as will be discussed in other exemplary embodiments. For illustration, FIG. 5(c) show the cross-sectional view for the device SD-2 implemented at the left section of the embodiment in FIG. 2.

In order to realize dual-polarity conduction for positive and negative ESD (triggering and snapback for both the positive and negative ESD), the two-section device as shown on either side of the dotted vertical line as shown in FIG. 2 can be used. The key junctions in the right section of FIG. 2 correspond to those in the left section but are labeled with numbers 4 and 6. Joining the right and left sections, one for the positive and the other for the negative ESD, will therefore generate several combinations of the two junctions discussed above and therefore different dual-polarity I-V characteristics with customized snapback behaviors.

Figure 5B:
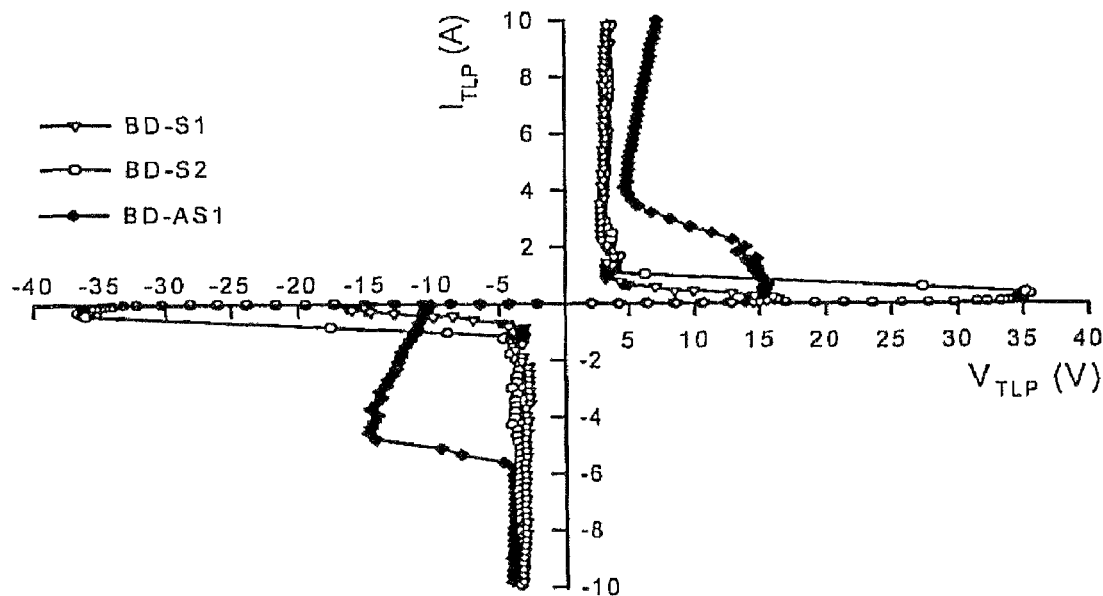
Figure 5C:
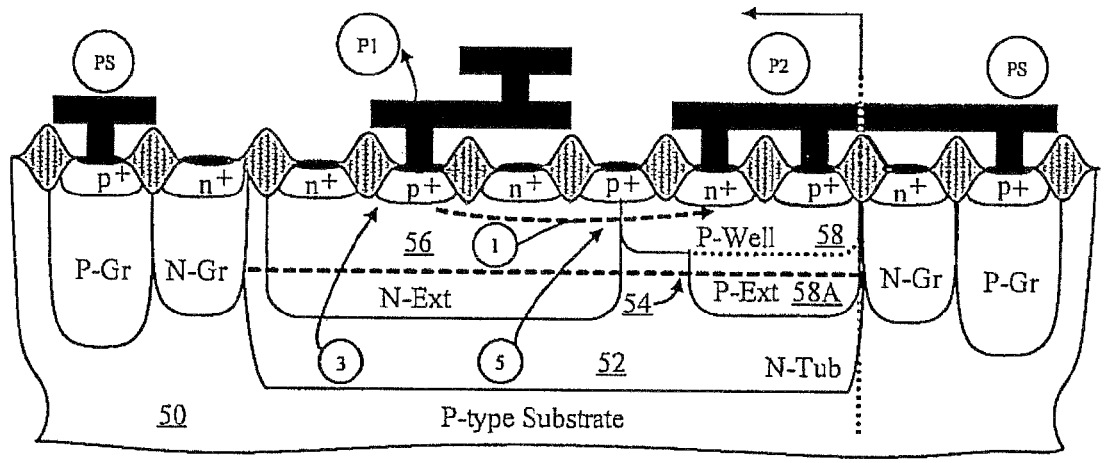
FIG. 5(c) shows the sub-section structure corresponding to the SD-2 I-V characteristics in FIG. 5(a)

FIG. 5(b) shows the measured results of three different two-section devices (BD-S1, BD-S2, and BD-AS1) having the following three junction combinations. First for BD-S1, the junction type shown in FIG. 3(c) was used for both of the junction types labeled 3 and 4 in FIG. 2 and the junction type shown in FIG. 4(b) was used for both of the junctions labeled 5 and 6 in FIG. 2. Second for BD-S2, the junction type shown in FIG. 3(c) was used for both of the junctions labeled 3 and 4 in FIG. 2 and the junction type shown in FIG. 4(e) was used for both of the junctions labeled 5 and 6 in FIG. 2. And third for BD-AS1 the junction types shown in FIG. 3(c) and FIG. 4(b) were used for the junctions labeled 3 and 5, respectively, and the junction types shown in FIG. 3(a) and FIG. 4(a) were used for the junctions labeled 4 and 6, respectively, in FIG. 2. Both BD-S1 and BD-S2 exhibit custom symmetrical I-V characteristics (i.e., identical trigger and holding voltages for positive and negative ESD), but BD-AS1 yields asymmetrical characteristics. In this particular case, the design can be adapted for the specific asymmetric operating voltage of dual protocol data communication transceivers. In addition, the three devices exhibit different trigger, holding, and on-state current characteristics. As such, they are useful for robust ESD protection design.

The three two-section devices, BD-S1, BD-S2, and BD-AS1 were also tested using the human body model (HBM), the machine model (MM), and the International Electrochemical Commission (IEC) ESD standards. With an area of about 120 μm×200 μm, the devices passed the maximum ESD stresses of 15 kV HBM, 2 kV MM, and 16.5 kV IEC. Table 1 summarizes the DC measurements and conducting characteristics of these three devices. More discussion about the information depicted in table 1 is provided later along with the explanation of other embodiments. As shown, the leakage currents are sufficiently low and thus the parasitic effects of the ESD protection structure on the functionality of the circuit protected are minimal.

Figure 6:
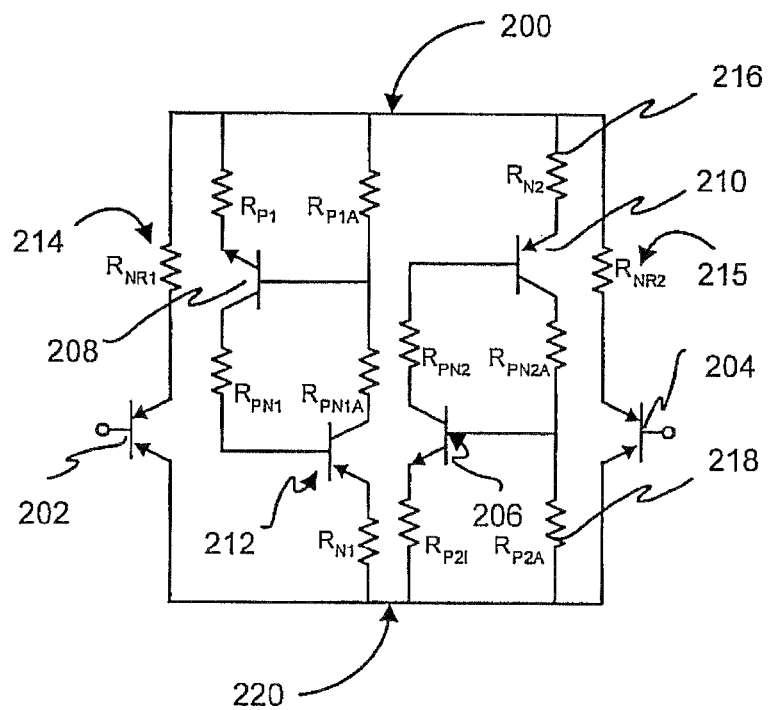
FIG. 6 depicts a simplified equivalent circuit of over-voltage dual-polarity ESD protection according to an embodiment of the invention.

Turning to FIG. 6, there is depicted an illustrative schematic representation of a dual-polarity protection structure according to various embodiments. A first region 200 is connected to a pad and a second region 220 is connected to a reference power rail voltage, namely $V_{SS}$. A first isolating open base bipolar junction transistor (BJT) 202 and a second isolating open base BJT 204 are connected through resistors 214, 215 between a first region 200 and a second region 220. These isolating BJTs can have different conducting characteristics and different open base breakdown (BVCEO). The minimum and maximum bidirectional breakdown voltage can be determined either by the minimum BVCEO of the outermost BJTs 202, 204 or by the conducting characteristics of the coupled transistor-resistor network between the first region 200 and the second region 220. According to various embodiments the conducting characteristics can be either restricted by the internal coupled network and or combined with the characteristics of the isolating open base BJTs. In this case, the outermost BJTs set a maximum voltage limit to avoid undesirable interaction with other devices close to the periphery of the protection structure.

When the voltage applied at the first region 200 is positive and high enough to reach the conducting condition defined by the coupled BJTs 210 and 206 and the resistive network, high conductivity modulation is obtained during the on-state conducting condition and the maximum voltage is clamped. The main blocking voltage junction will be defined by the collector-base junction of 206. When the voltage applied at the first terminal is negative and high enough to reach the voltage breakdown of the coupled BJTs 212 and 208 along with the resistive network, high conductivity modulation allows for draining considerable amount of current through the device and the maximum negative voltage is clamped. The main blocking voltage junction will be defined by the collector-base junction of 208.

In the sub-sections shown in FIGS. 7A and 7B the trigger voltage can be designed to be primarily defined by the blocking junction below isolation area 70. According to various embodiments, it can be (N-Ext to P-Ext), (N-Ext to P-Well), (N-Well to P-Ext), (N-Well to P-Well). For the reverse situation, however, the reverse blocking voltage can be defined at the reverse P-N junction below contact 100 (for instance, 56 to 72A) in FIG. 7A, or contact 102 (e.g. 56 to 68A) in FIG. 7B. In these sections, the reverse blocking junction does not have a major effect in the definition of the trigger voltage in forward operating condition. As such, reverse and forward conduction can be independently adjusted.

Figure 7A:
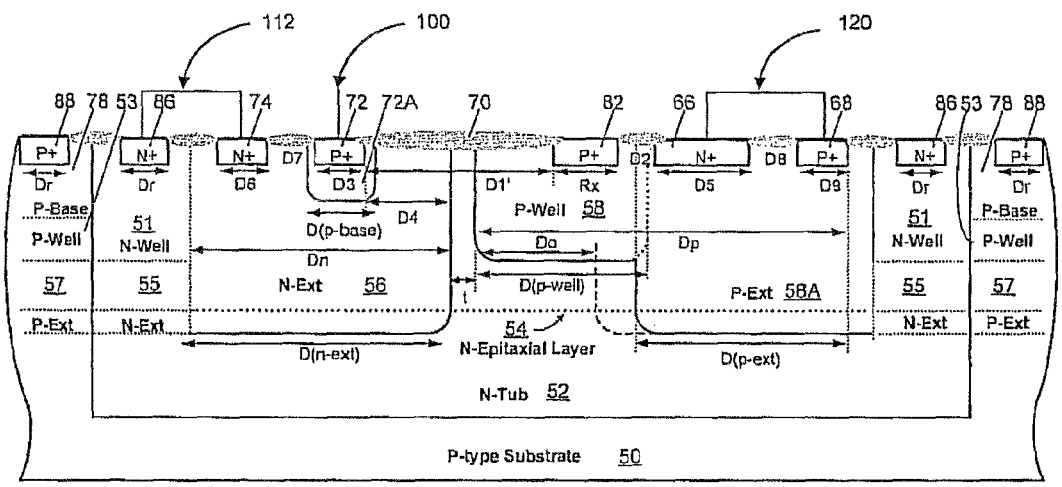
FIGS. 7A and 7B are cross-sectional views of the n- and p-type MSSTT (modified single substrate trigger thyristor) basic cell for the DP-STT (dual polarity substrate trigger thyristor) according to an embodiment of the invention.
Figure 7B:
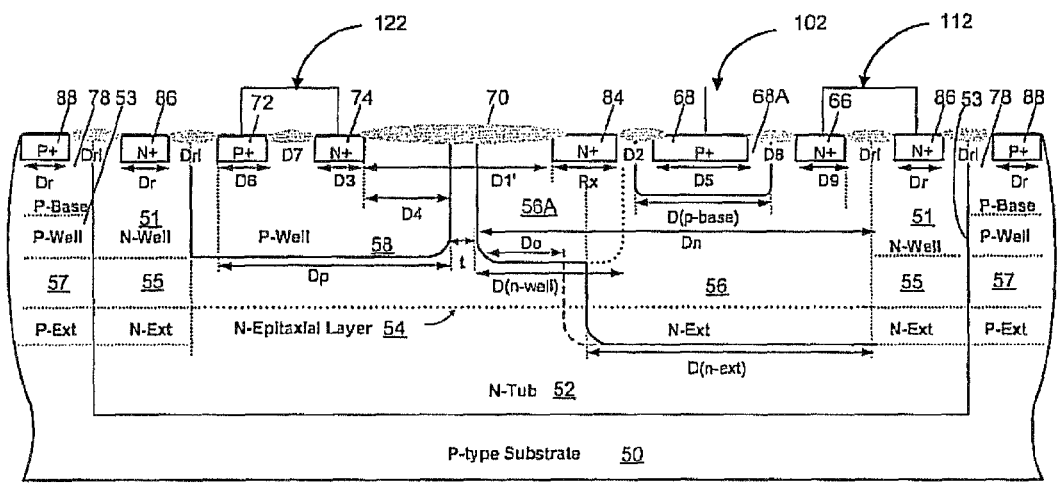

FIGS. 7A and 7B show the cross-sectional view of the n- and p-type MSSTT sub-sections, respectively. According to various embodiments, an N-Tub layer 52 is formed on the surface of a p-type silicon wafer 50 with an n-type Epitaxial layer 54. N-Ext 55, N-Well 51, and LDD N$^+$ 86 are implanted at both sides of the device, and this n-type region extends vertically to the N-Tub 52. P-Ext 57, P-Base 78, P-Well 53, and LDD P$^+$ 88 are implanted at both sides of the device and this p-type region extends vertically to the p-type substrate 50. The n- and the p-type regions previously described form guard-ring isolation around the effective area of the device. This guard ring isolation is customized and applied according to various embodiments.

An N-Ext, 56 in FIG. 7A, and additional doping, 56A for FIG. 7B, are implanted to be used as an intermediate layer at the first electrode side, 100 in FIG. 7A, and 102 in FIG. 7B. P-Ext 58A and P-Well 58 in FIG. 7A and FIG. 7B are implanted into the N-Epitaxial-layer 54 parallel to the previous N-Ext 56 in FIG. 7A and FIG. 7B, and are used as an intermediate layer in the second electrode side 120 in FIG. 7A, and 122 in FIG. 7B. These regions extend in both the vertical and the lateral directions. In the vertical direction, they extend into the N-Epitaxial layer 54 and in the lateral direction they create the forward blocking p-n junction in the center of the device. The region placed below the first electrode (72A in FIG. 7A or 68A in FIG. 7B) is alternatively considered for fine adjustment of the reverse breakdown voltage. A gap "t" between the first region (56 in FIG. 7B) or (56A in FIG. 7B), and the second region (58 in FIG. 7B and FIG. 7A) can be also designed to increase the forward blocking voltage and on-state holding current.

Figure 8A:
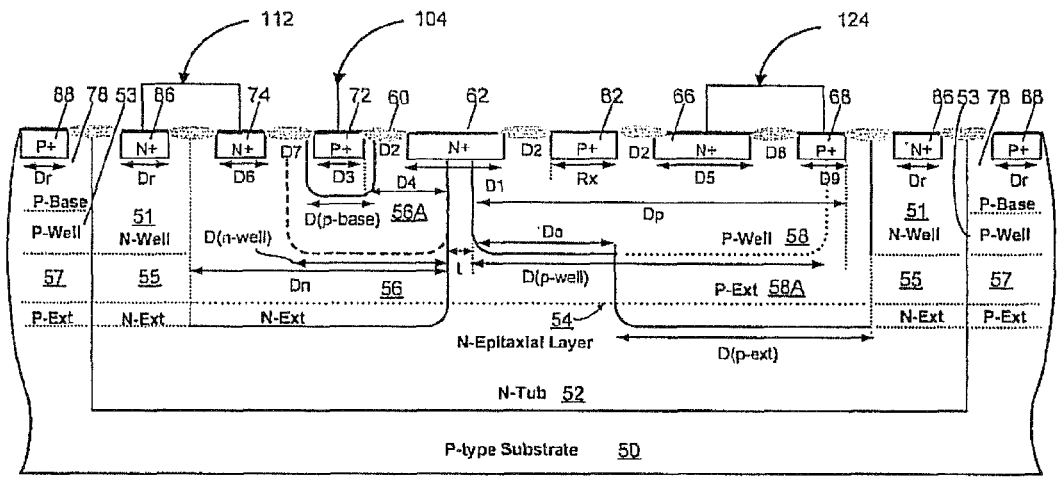
FIGS. 8A and 8B are cross-sectional views of the n- and p-type MDSTT (modified dual substrate trigger thyristor) basic cell for the DP-STT (dual polarity substrate trigger thyristor) according to another embodiment of the invention.
Figure 8B:
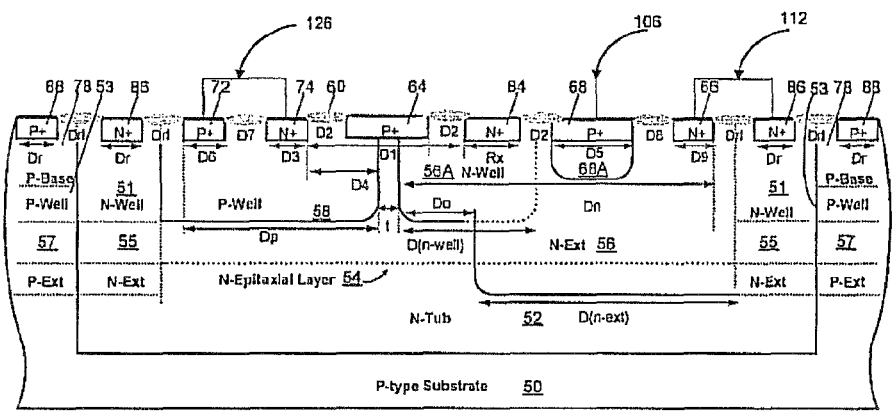

In another embodiment, shown for example, in FIGS. 8A and 8B, LDD N+ and P+ regions 72 and 74, respectively, are implanted for adjustment of the forward blocking junction. LDD N+ and LDD P+ regions 66, 68 are implanted in the intermediate P-Ext 58A or in the intermediate N-Ext 56 in FIG. 7A and FIG. 7B (FIGS. 8A and 8B), respectively. Regions 66 and 68 are located in the second electrode side for FIG. 7A (8A) and in the first electrode side for FIG. 7B (8B).

LDD P+ and N+ regions 72, 74 are implanted in the N-Ext 56 and P-Well 58 for FIGS. 7A (8A) and 7B (8B), respectively. Regions 72 and 74 are located in the first electrode side in FIG. 7A (8A) and in the second electrode side for FIG. 7B (8B).

Isolation areas, e.g. 60 in FIGS. 8A and 8B, are grown in the spacing between LDD implantations, and also on the blocking junction, 70 in FIGS. 7A and 7B. The trigger and holding voltages of the MSSTT increase when D1' is increased.

The LDD N+ regions 62, 66, 74, 84 and 86 are typically implanted in the same process step, but may alternatively be separate implantation steps. Similar implantations can be applied to the LDD P+ regions 64, 68, 72, 82, and 88.

Figure 9A:
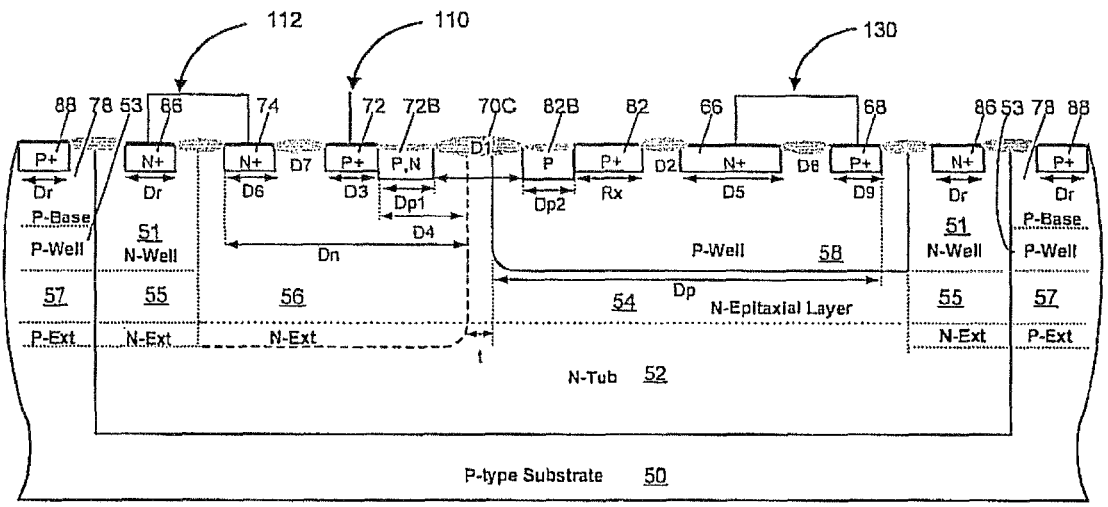
FIGS. 9A and 9B are cross-sectional views of the n- and p-type MSTT (modified substrate trigger thyristor) with silicide blocking and degrade doping control approaching the blocking junction for customized design of the ESD protection according to another embodiment of the invention.
Figure 9B:
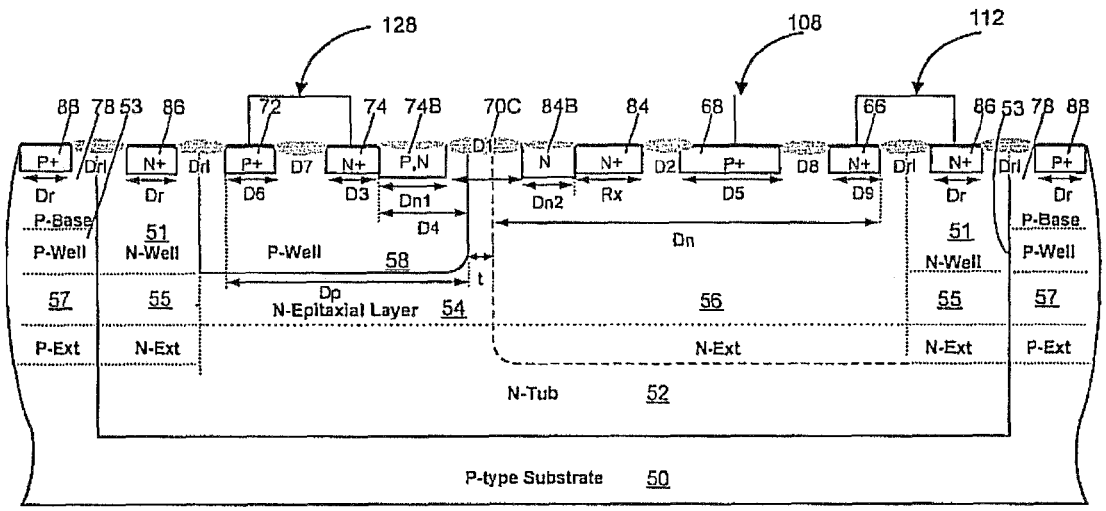

The embodiment in FIGS. 9A and 9B include additional LDD P+ and N+ buffer implantations (72B and 82B in FIG. 9A or 74B and 84B in FIG. 9B), next to the blocking junction isolation 70C. In this case, the additional implantations act as the limiting factor of the space charge region expansion in the blocking junction and allow for junction engineering previously discussed for other junction embodiments depicted in FIGS. 4(a)-4(l).

Figure 10A:
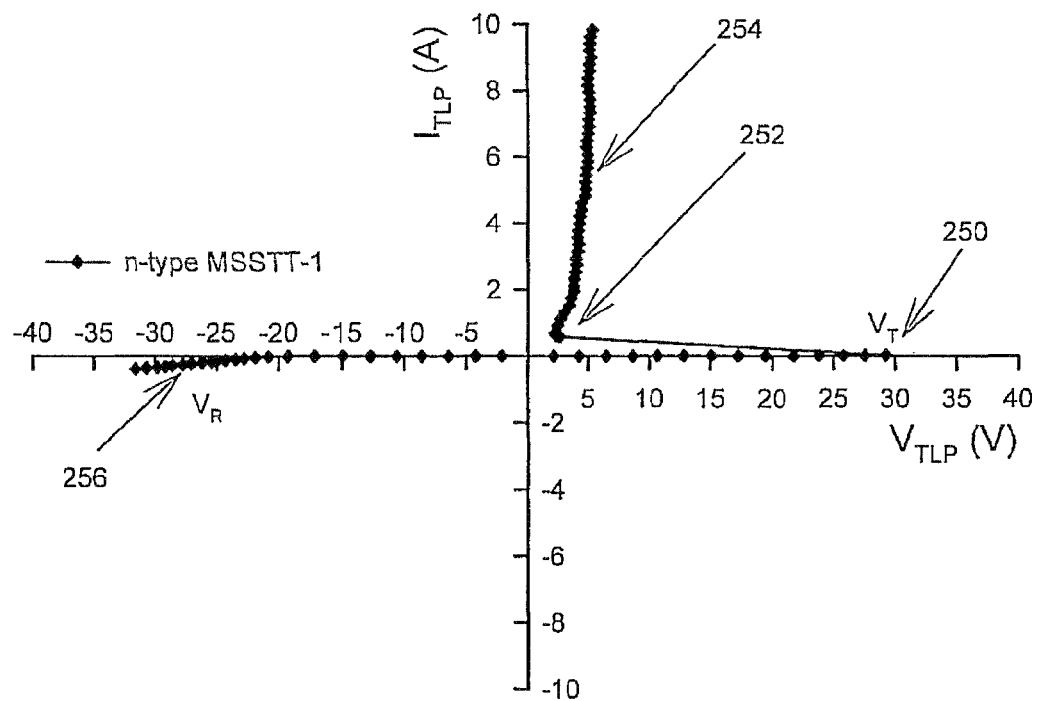
FIGS. 10A and 10B show two samples of measured forward and reverse transmission line pulse (TLP) I-V characteristics for single n-type MSSTT according to an embodiment of the invention.

FIGS. 7A, 7B, 8A, 8B, 9A, and 9B depict the various lateral dimensions adjusted according to various embodiments of the invention. These layout dimensions are also discussed later with accompanying I-V characteristics. On-wafer tests using an industry standard transmission line pulsed (TLP) instrument, which provides square pulses 100 ns wide and variable rise times of 200 ps, 2 ns and 10 ns are shown herein. For example, FIG. 10A shows the trigger voltage 250, the reverse breakdown voltage 256, the holding voltage 252, and the on-state resistance 254, corresponding to the N-MSSTT-1 with the dimensions shown in Table 2A.

Figure 10B:
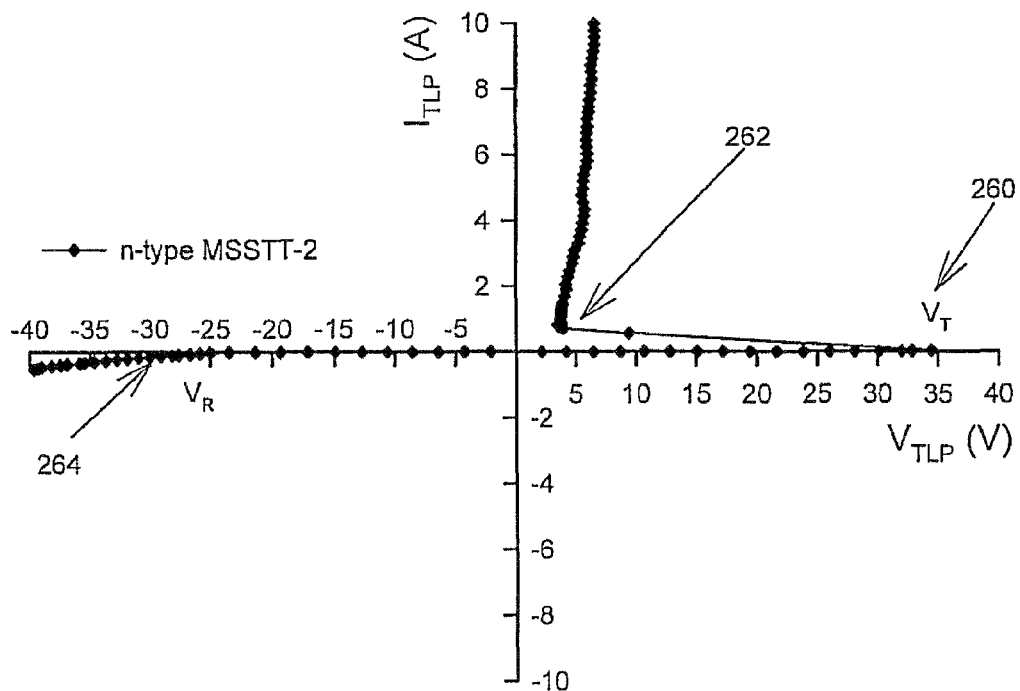

The dimensions used in the devices allow for the adjustment of the I-V characteristics, for instance for the case of the I-V characteristics in FIG. 10B, higher trigger and holding voltages are obtained in forward and reverse by changing the distances D1' and D4, and including the region D(p-base). Alternatively, Table 2A also shows the dimensions for the device called N-MSSTT-3, which shows the dimension for the D(p-ext), applicable for an embodiment where graded doping in the cathode is implemented.

Figure 11A:
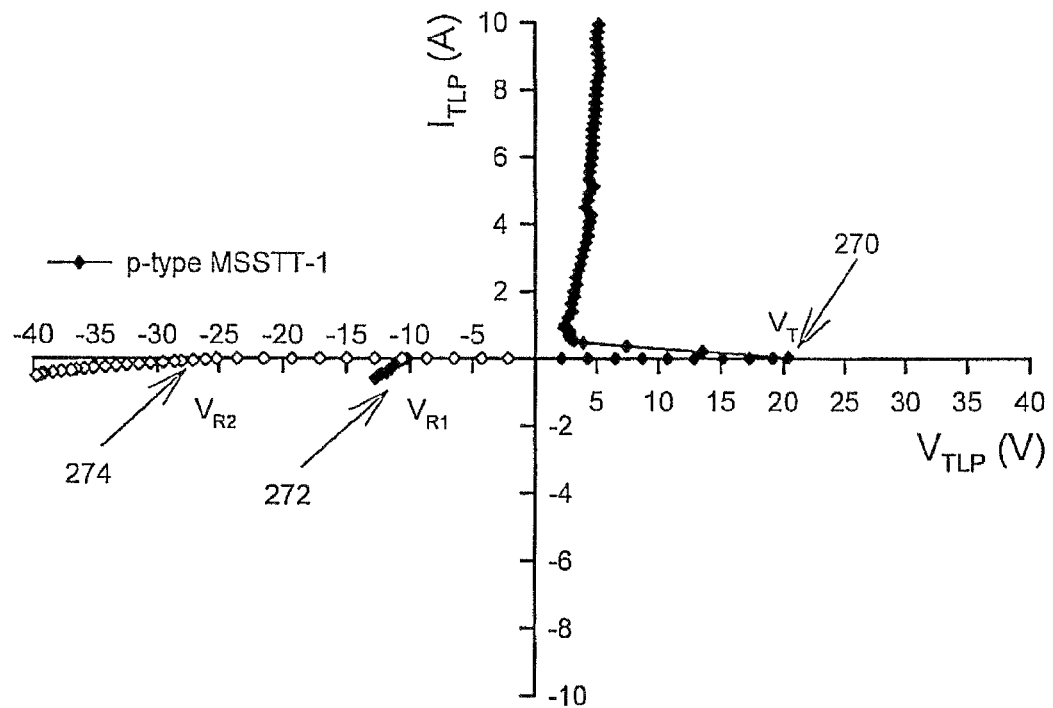
FIGS. 11A and 11B show two samples of measured forward and reverse TLP I-V characteristics for single p-type MSSTT according to an embodiment of the invention.
Figure 11B:
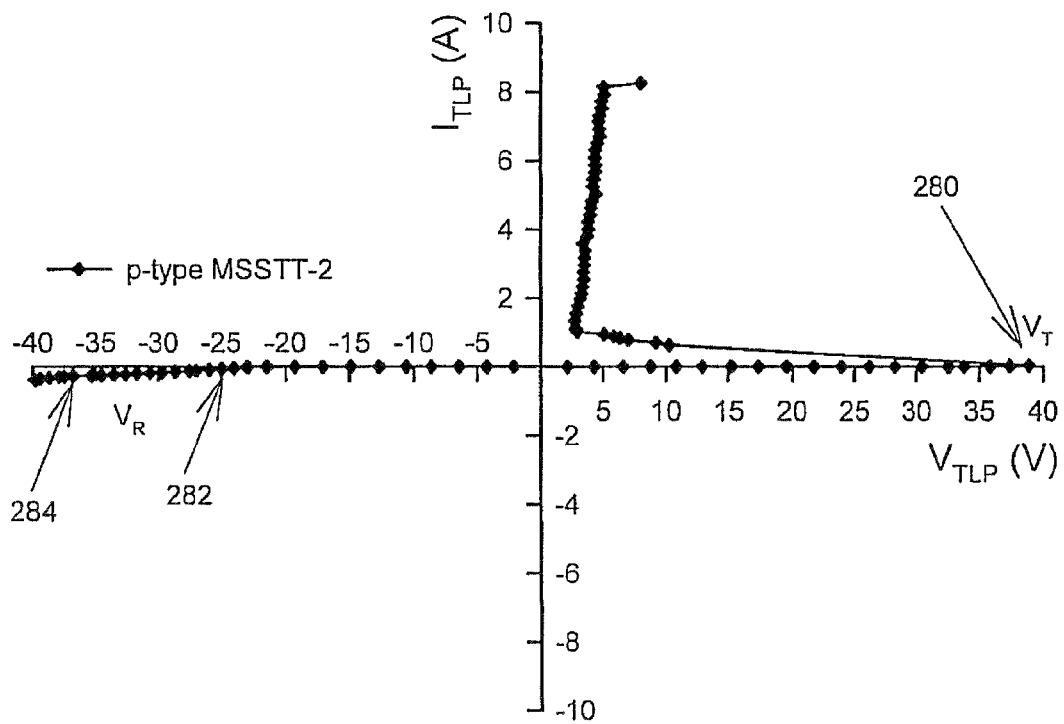
Figure 12A:
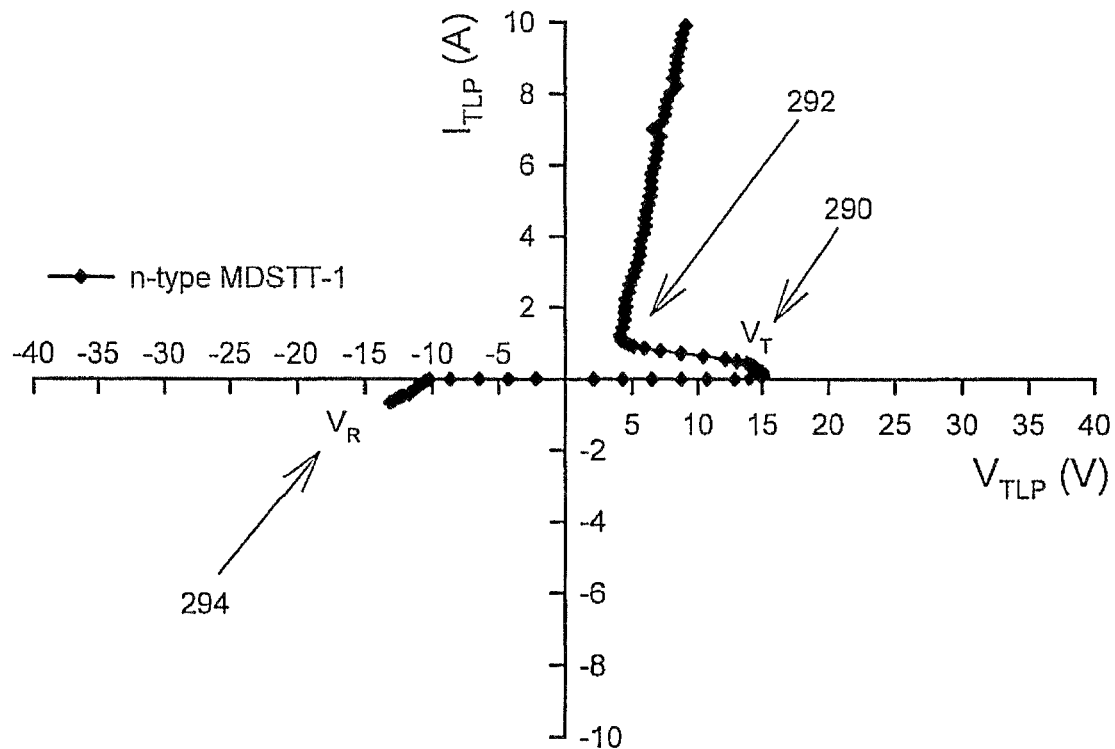
FIGS. 12A and 12B show two samples of measured forward and reverse TLP I-V characteristics for single n-type MDSTT according to an embodiment of the invention.
Figure 12B:
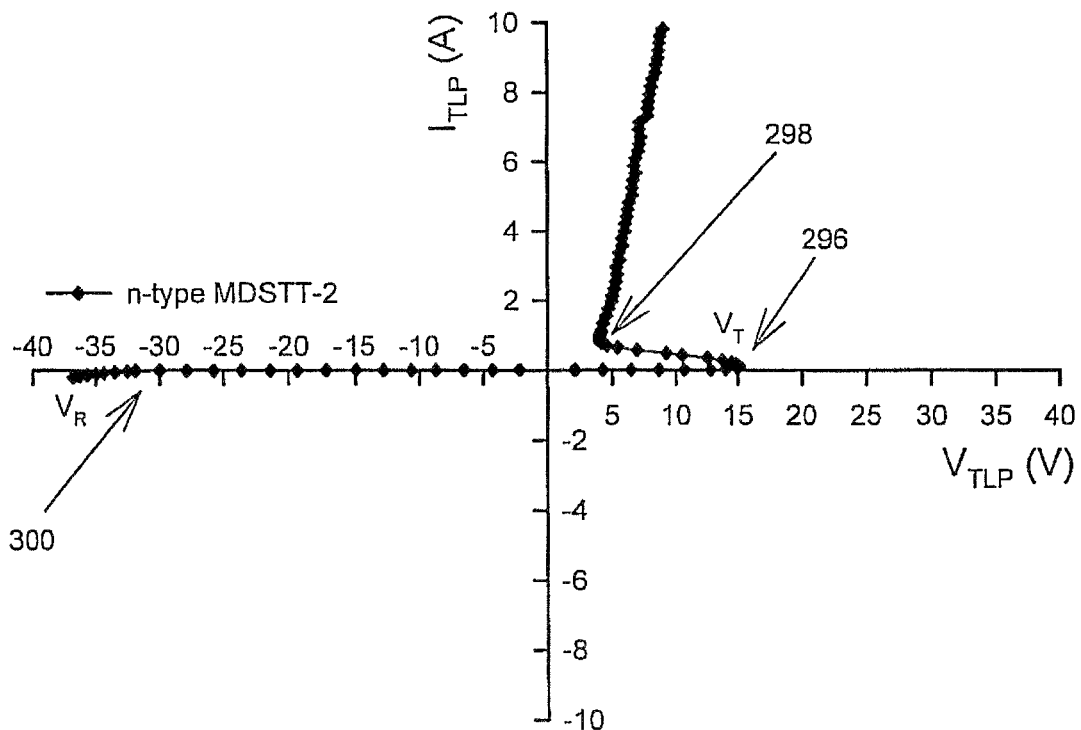
Figure 13A:
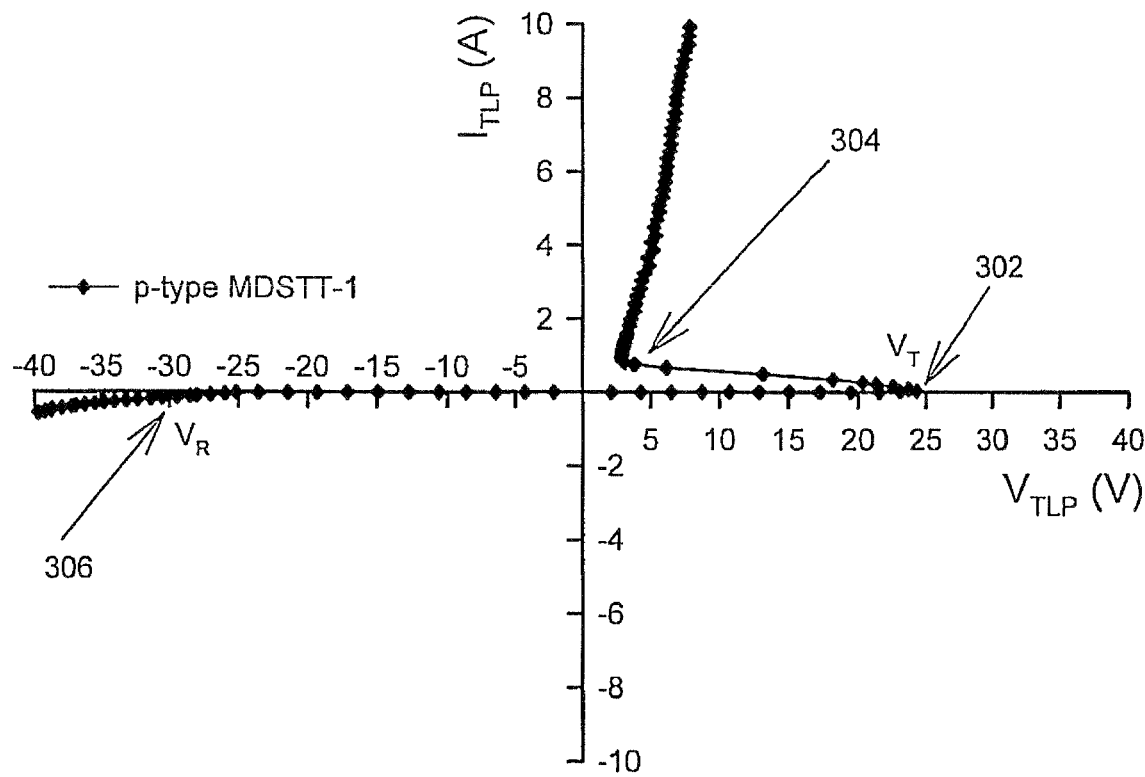
FIGS. 13A and 13B show two samples of measured forward and reverse TLP I-V characteristics for single p-type MDSTT according to an embodiment of the invention.
Figure 13B:
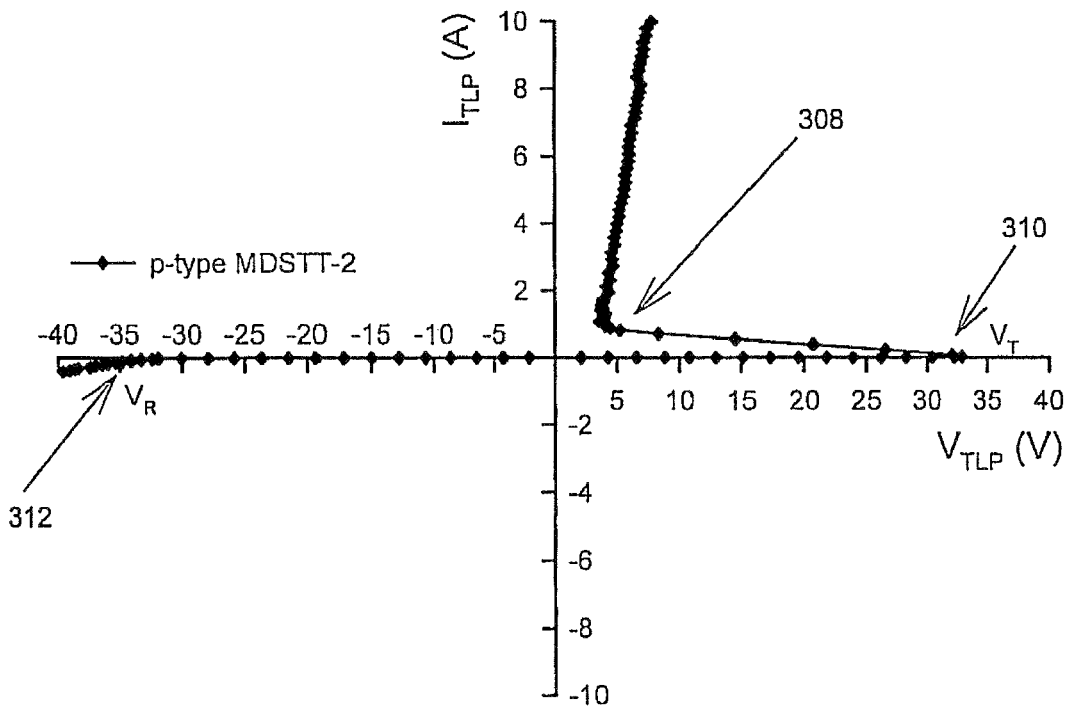

For the complementary p-type MSSTT, the I-V characteristics and dimensions of the devices are shown in FIGS. 11A and 11B and Table 2B, respectively. FIG. 11A shows the forward and reverse I-V characteristics for the device P-MSSTT-1 with trigger voltage 270 lower than the I-V characteristics in FIGS. 10A and 10B and for the negative region, two possible reverse conducting voltages, $V_{R1}$ (272) and $V_{R2}$ (274), where 272 is obtained for P-MSSTT-1 and 274 is obtained for P-MSSTT-3. In both of these cases, the forward I-V characteristics closely overlapped. FIG. 11B shows the I-V characteristics for another embodiment with higher trigger. This is realized by using the dimensions of the device P-MSSTT-2 in Table 2B. This device triggers 280 close to 40 V, while the reverse I-V characteristics shows conduction at about −27 V, 282, and goes with a high resistance 284 characteristics until about −45 V. In this device by increasing the distance D1', the trigger is shifted to higher voltages, however, further increase of D1' also reduces the maximum failure current.

I-V characteristics are also shown in FIGS. 12A and 12B and 13A and 13B for the n- and p-type MDSTT. These figures illustrate other methods to adjust the general S-Type I-V characteristics, and more specifically, the trigger voltage at 15 V (290 in FIGS. 12A and 296 in FIG. 12B), 25 V (302 in FIG. 13A) and 33 V (310 in FIG. 13B). The corresponding dimensions used for these devices are shown in Tables 3A and 3B, with Table 3A for the n-type MDSTT and Table 3B for the p-type MDSTT. These tables show direct layout dimensions of the devices, aimed to provide, along with the exemplary I-V characteristics, better orientation to the design engineers about the dimensional order of the previously discussed embodiments. By using these dimensions and accompanying discussion, a dual-polarity characteristic can be customized to the variety of ESD protection operating conditions required in most semiconductor applications.

Figure 14:
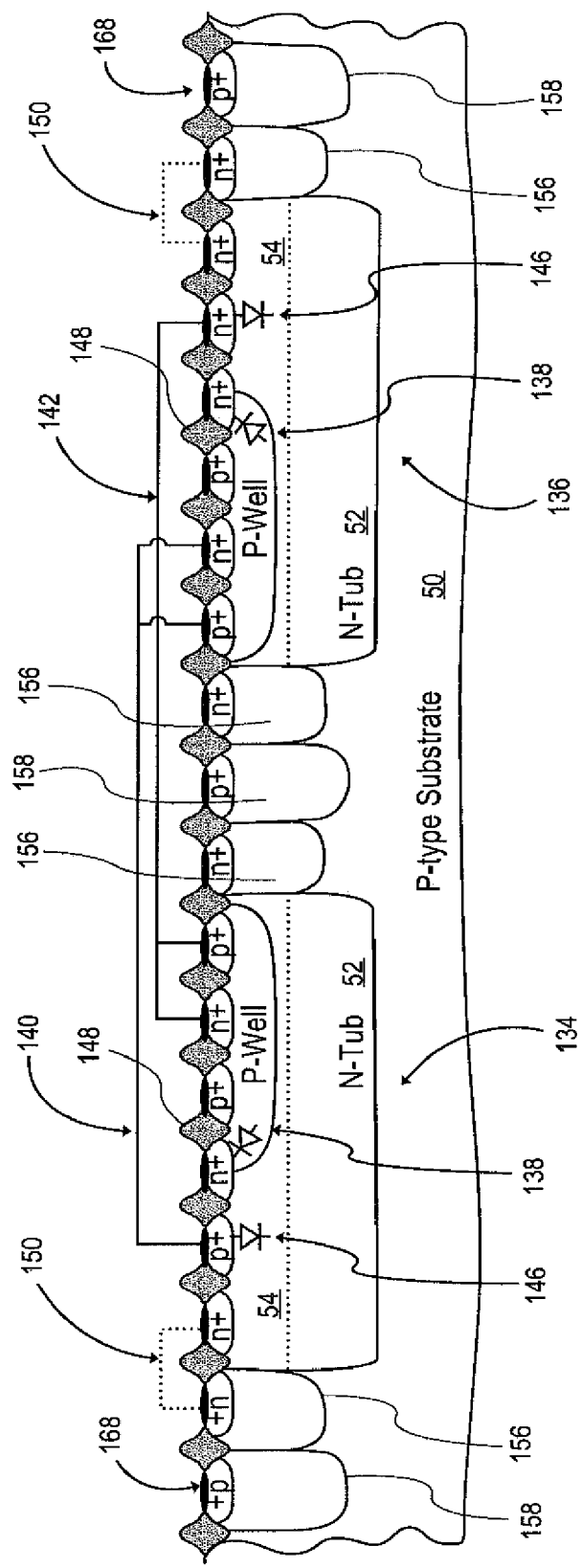
FIG. 14 shows a cross-sectional view of a symmetric 15 V dual-polarity trigger STT according to another embodiment of the invention. The device shown in FIG. 14 can comprise an intermediate guard ring separation.

Turning to FIG. 14, this embodiment allows for I/O Pad ESD protection in circuits operating at symmetric bipolar voltages, e.g. ±15 V. Two electrodes are indicated by 140 and 142, each of them connected to different regions of the device and connected to the protected pad and ground, respectively. A first n-type MDSTT sub-section 134 provides ESD protection for current flowing from 140 to 142 and vice versa for the n-type MDSTT sub section 136. The current flowing in opposite directions between the two connecting points uses different discharging paths and includes an intermediate guard ring 156, and 158 for isolation between the sub-sections of the device. In the outermost part of the device are also shown the guard ring isolation 158 and 156, which avoid interaction between the ESD protection and the rest of the protected circuit.

Figure 15:
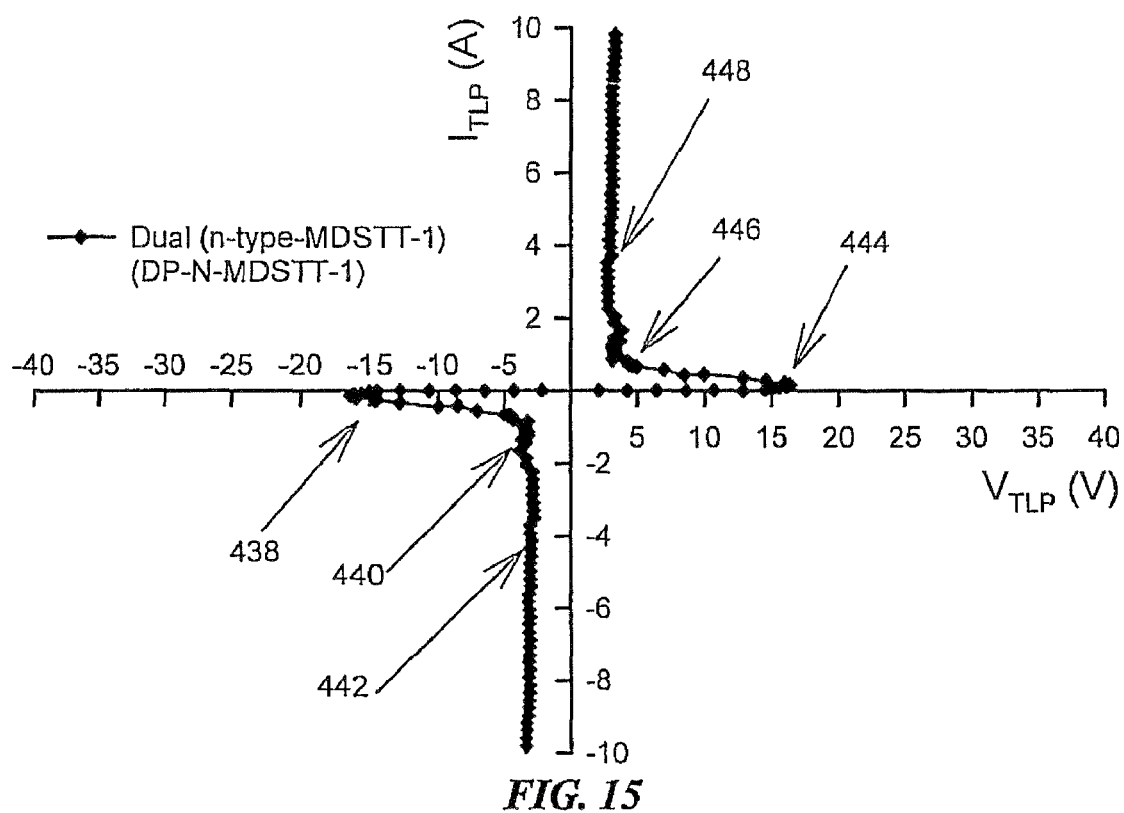
FIG. 15 shows the TLP I-V characteristics for the symmetric 15 V DP-STT in FIG. 14 using a 5 finger structure for providing protection from damage causes by IEC-type ESD stress over 16.5 kV positive and negative pulses according to an embodiment of the invention.

The blocking junctions in the design of the symmetric I-V characteristics 138 and 146 determine the trigger and reverse blocking voltage of the device's sub-sections. The forward blocking junction 138 is designed close to the required trigger voltage, and the reverse blocking junction 146 can sustain a blocking voltage higher than the trigger. FIG. 15 shows the TLP I-V characteristics measured for a device using the device scheme in FIG. 14, the layout embodiment with inter-finger guard ring isolation, and 5 fingers (200 μm widths) for each sub-section. The different layout schemes and related trade-offs will be presented later. The DC measurements and ESD performance of this device are summarized in Table 1. The forward 448 and reverse 442 I-V characteristics show a very low on-state resistance, which permits a sustain and elevated ESD current stress, a low leakage current associated to the high off-state resistance below the forward and reverse symmetric trigger voltages 444 and 438, respectively, and relatively high currents at the forward and reverse holding voltages, 446 and 440, respectively. The sub-sections of the ±15 V DP-STT follow the dimensions given for the embodiment N-MDSTT-2 in Table 3A.

Figure 16A:
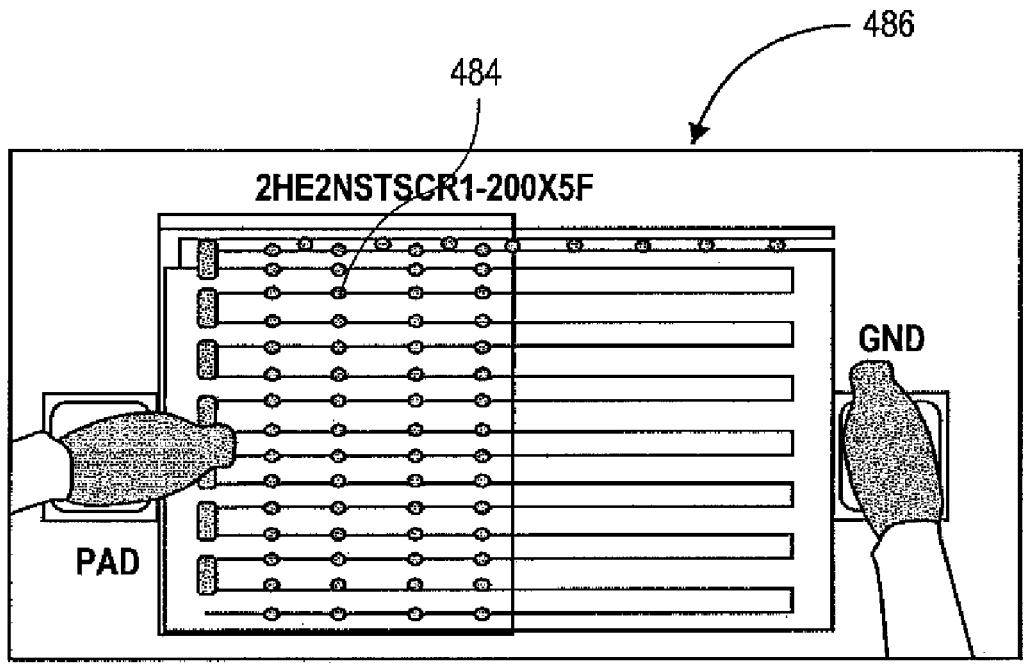
FIGS. 16A, 16B are Emission Microscopy (EMMI) images of the optical beam induced current (OBIC) showing uniform finger conduction for positive and negative ESD current applied in a 15 V DP-STT according to an embodiment of the invention.
Figure 16B:
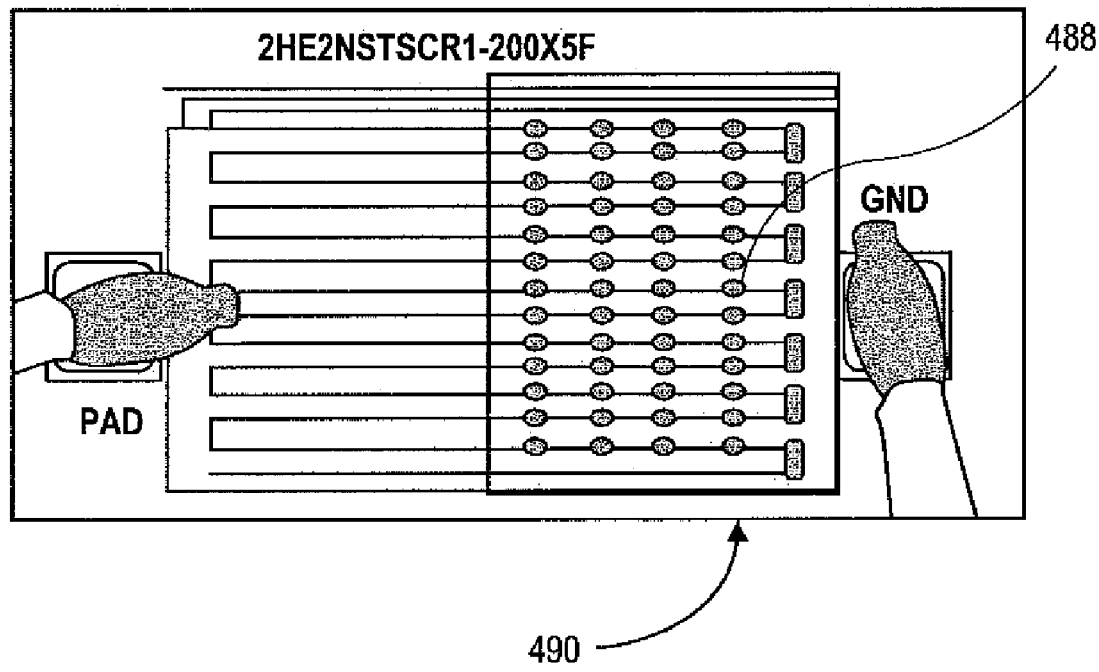

The layout micrograph of the fabricated embodiment for ±15 V operating voltage is also depicted in FIGS. 16A and 16B via Emission Microscopy (EMMI) images of the optical beam induced current (OBIC). For the PAD to GND ESD current conduction 486, the five fingers closer to the PAD 484 show optical beam induced light, corresponding to the high current density and uniform current distribution throughout the five fingers. For the GND to PAD current conduction 490, the five fingers closer to the GND 488 show uniform light emission, corresponding to the high current density and uniform current distribution throughout the five fingers during the on-state, 440 in FIG. 15.

Figure 17:
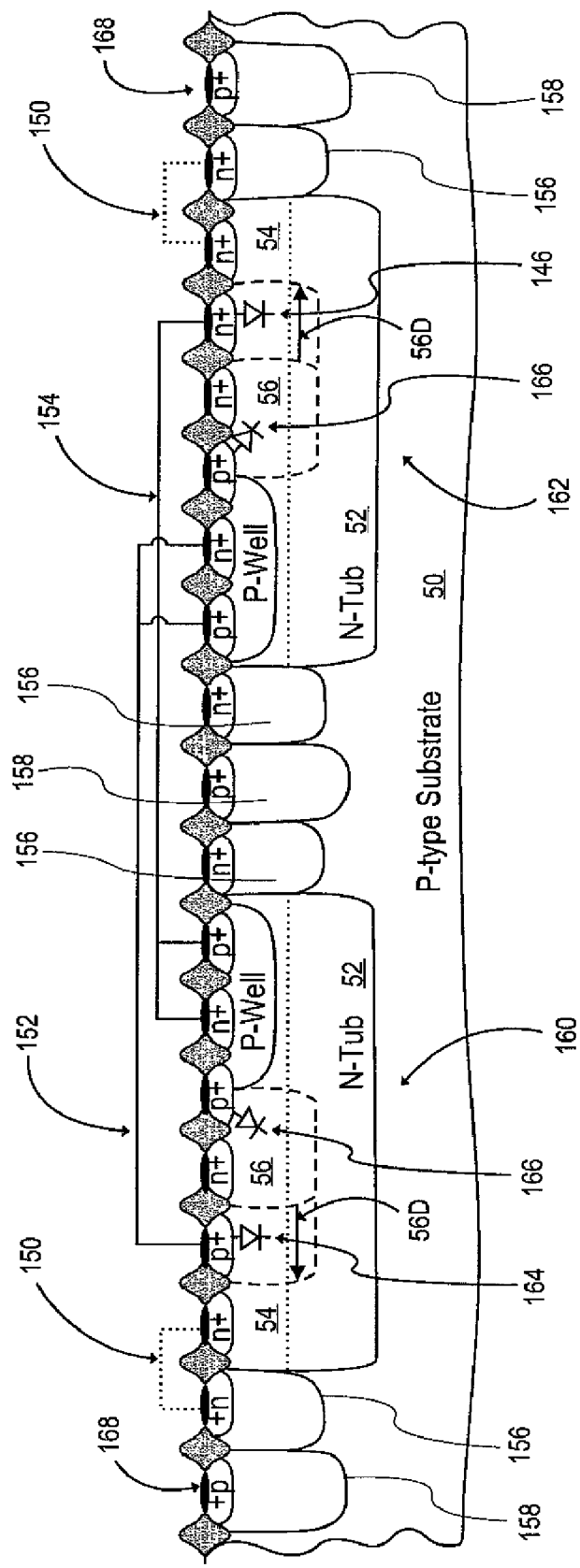
FIG. 17 shows a cross-sectional view of a symmetric 25 V dual-polarity trigger STT according to an embodiment of the invention. The device shown in FIG. 17 can comprise an intermediate guard ring separation.
Figure 18:
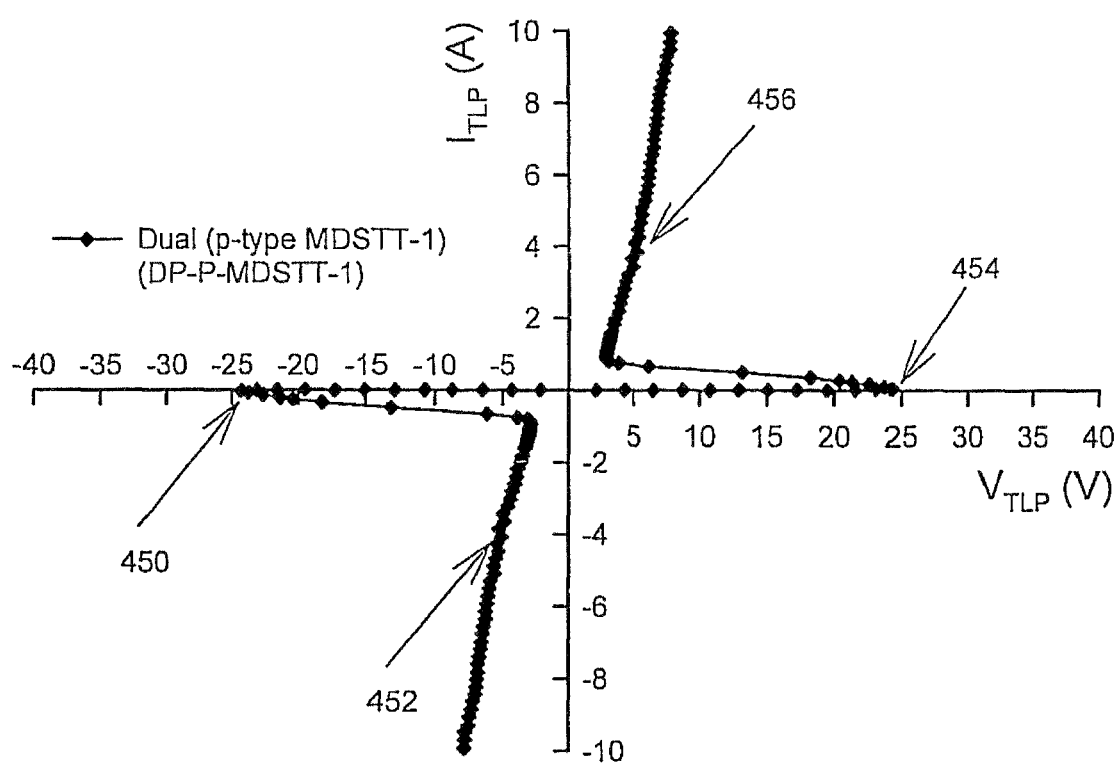
FIG. 18 shows the TLP I-V characteristics for the symmetric 25 V DP-STT in FIG. 17 using a 1 finger device according to an embodiment of the invention.

FIG. 17 shows a second embodiment for a symmetric DP-STT ESD protection device for a circuit operating at a bipolar I/O voltage range of about to ±25 V. Similar to the description provided for FIG. 14, there are symmetric sub-sections (160 and 162), in this case p-type MDSTT-1 (Table 3B), each of them providing ESD protection for current flowing in the opposite directions. The P1/N2/P2/N1 structure defined for each subsection present a combination of forward and reverse blocking junctions, 166 and 164, that give rise to the I-V characteristics shown in FIG. 18. The forward and reverse I-V characteristics 456 and 452, respectively, are obtained for a two-section one-finger 200 μm width device. The symmetric trigger voltage, 454 and 450 in FIG. 18, are measured very close to the established ±25 V, while the device conductivity modulation is ideal for ESD protection without latchup problems.

Figure 19:
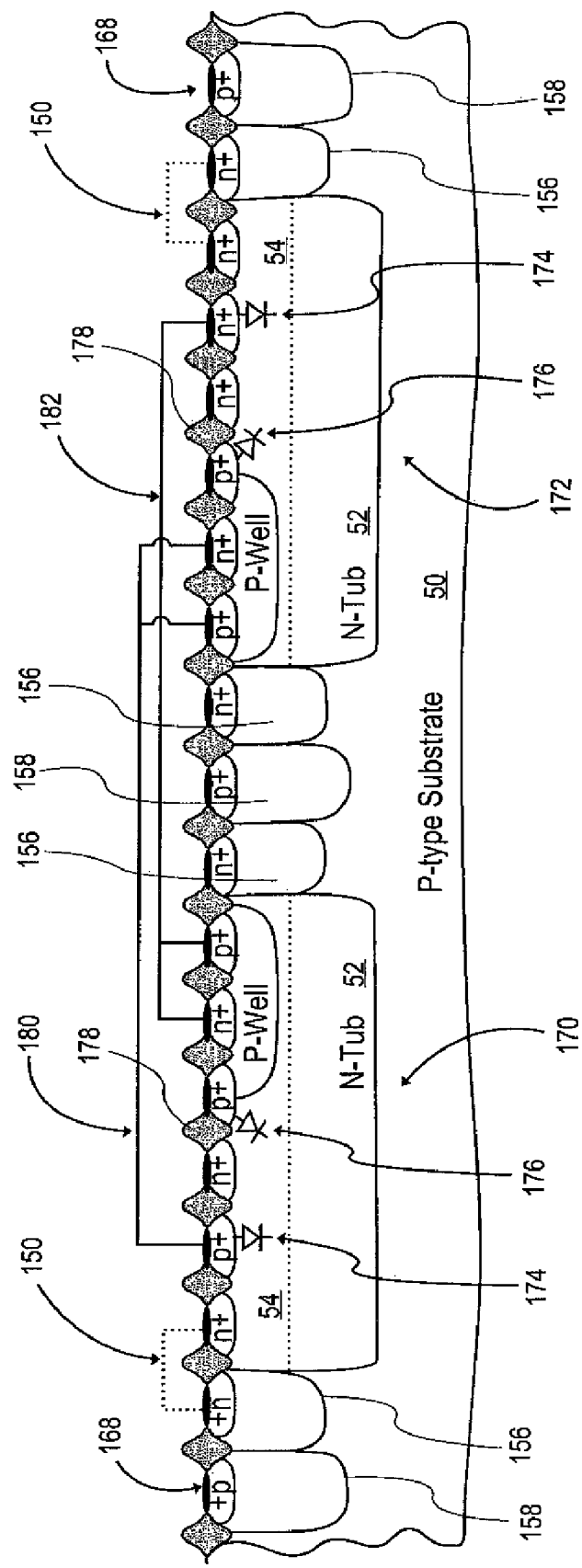
FIG. 19 shows a cross-sectional view of a symmetric 35 V dual-polarity trigger STT according to an embodiment of the invention. The device shown in FIG. 19 can comprise an intermediate guard ring separation.
Figure 20:
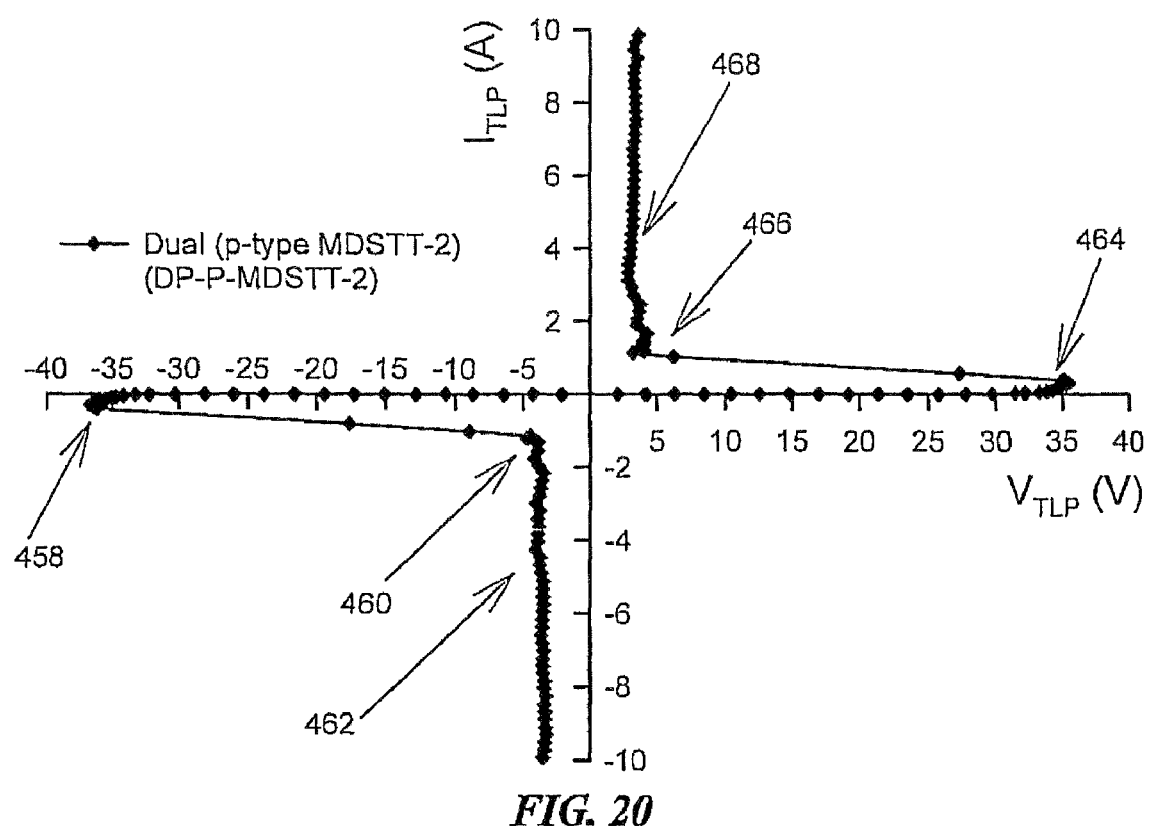
FIG. 20 shows the TLP I-V characteristics for the symmetric 35 V DP-STT in FIG. 19 using a 5 finger structure for providing protection from damage causes by IEC-type ESD stress over 16.5 kV positive and negative pulses according to an embodiment of the invention.

FIG. 19 shows a third embodiment for still higher trigger voltages. This cross-sectional view depicts a single finger DP-STT for symmetric trigger voltage over ±30 V. This embodiment maintains the general scheme of the two previous embodiments, but the sub-section blocking junctions are defined differently, see sub-sections 170 and 172, corresponding to an embodiment of the p-type MDSTT (P-MDSTT-2 in Table 3B). The forward blocking junction 176 is graded by the low doping concentration of the N-Epi 54. The reverse blocking junction 174 allows for conduction of the device without interaction between the parasitics formed with the p-side of the guard ring 168 and the device's electrodes, 180 and 182. FIG. 20 shows the resulting symmetric TLP I-V characteristics, 462 and 468, for a five finger device using the inter-finger guard ring isolation. The forward and reverse trigger voltages, 464 and 458, are close to ±36 V and the currents at the holding voltages, 460 and 466, are over 1 Amp, while the on-state resistance allows for ESD current flows over 60 Amps peak. The DC measurements and ESD performance of this device are summarized in Table 1.

The micrograph of the ±36 V trigger voltage device is depicted in FIGS. 21A and 21B via Emission Microscopy (EMMI) images of the optical beam induced current (OBIC). When the PAD to GND voltage is close to the forward trigger voltage 498, the five fingers closer to the PAD 492 generate high intensity of light, corresponding to the uniform current distribution throughout the five fingers during the triggering process, while the very weak radiation in the five fingers at the right hand side (closer to GND) is associated with the reverse leakage in that sub-section of the device. When the GND to PAD voltage is higher than the reverse trigger voltage, current conduction 496 is obtained in the five fingers closer to the GND 494, and all of them generate a relatively high intensity of light, corresponding to the high current density and uniform current distribution throughout the five fingers during the on-state.

Figure 22:
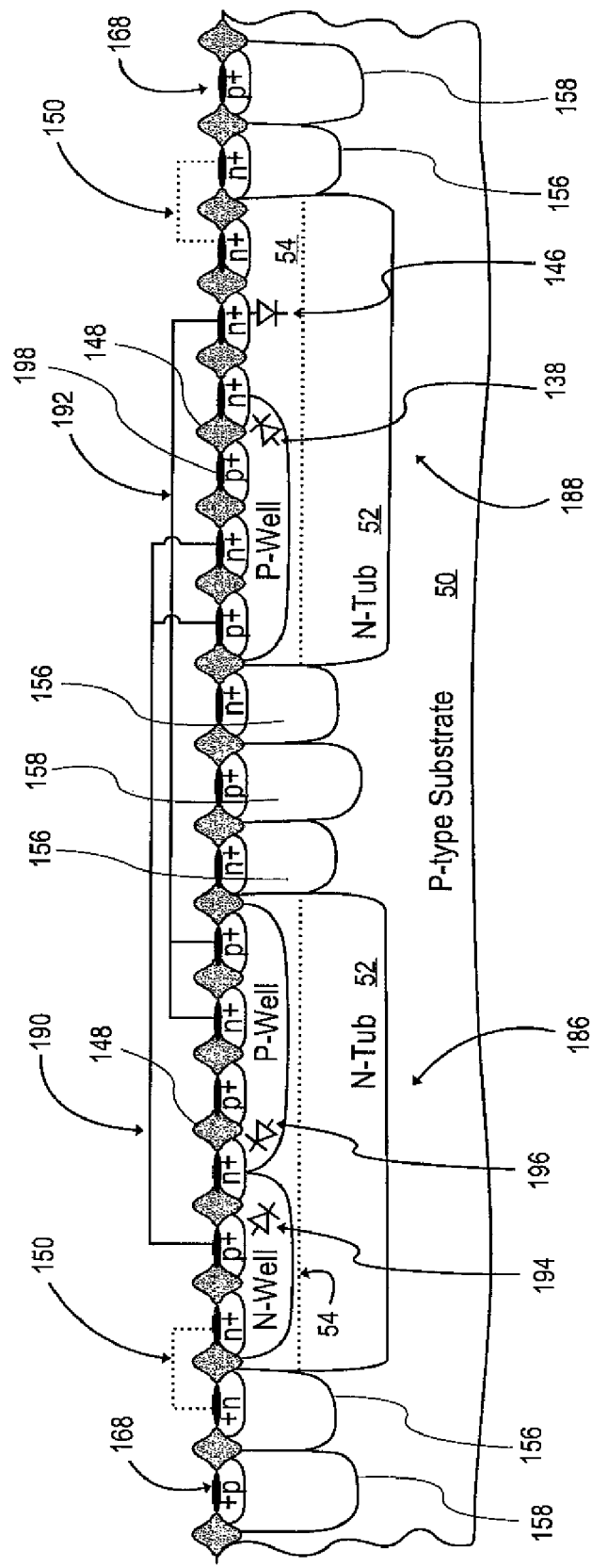
FIG. 22 is the cross-sectional view of an asymmetric (−10 V to 15 V) dual-polarity STT according to an embodiment of the invention. The device shown in FIG. 22 can comprise an intermediate guard ring separation.
Figure 23:
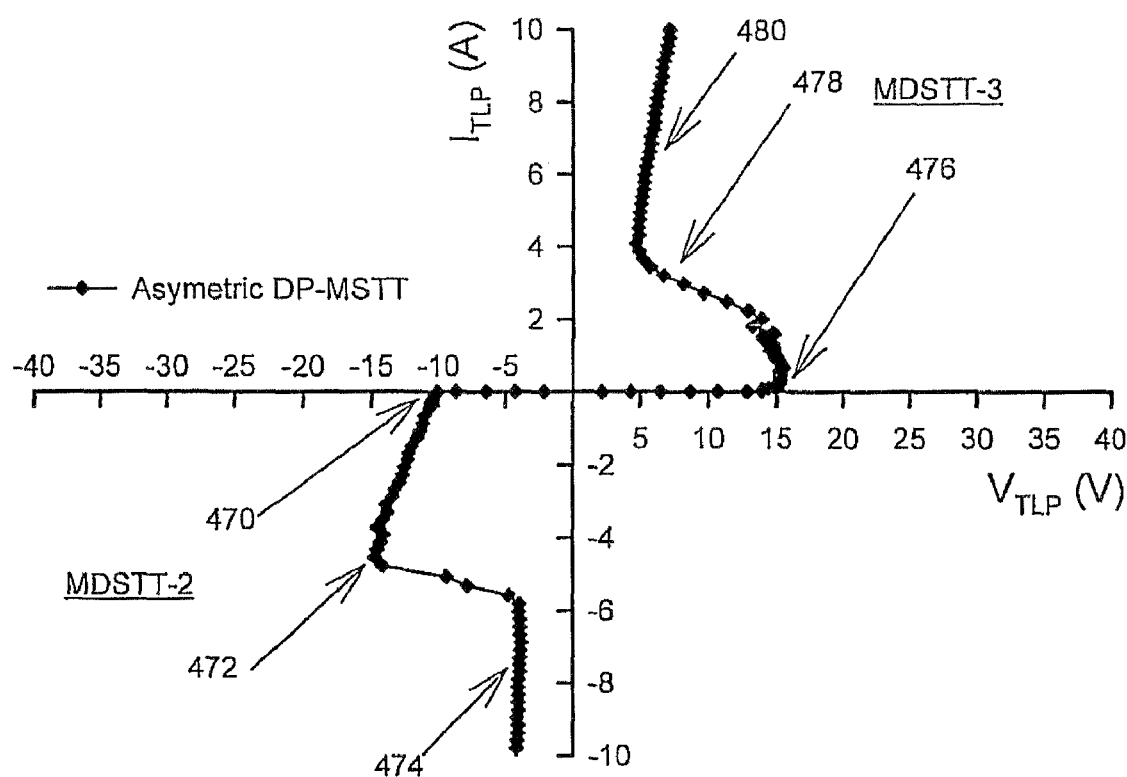
FIG. 23 shows the TLP I-V characteristics for the asymmetric (−10 V to 15 V) DP-STT in FIG. 22 using a 5 finger structure for providing protection from damage causes by IEC-type ESD stress over 16.5 kV positive and negative pulses according to an embodiment of the invention.

FIG. 22 on the other hand, shows an embodiment for asymmetric (−10 V to 15 V) bidirectional operating conditions and high holding- and trigger-current, using a combination of forward and reverse conduction of the DP-STT sub-sections. The sub-section of the device at the left hand side 186 (N-MDSTT-3 in Table 3A) depicts the first 196 and the second 194 blocking junctions used to adjust the conducting characteristics of the positive side of the device I-V characteristics, 480 in FIG. 23. In this embodiment, the electrode 190 is connected to the pad and the electrode 192 is connected to ground, however, the opposite case can be also implemented. The sub-section at the right hand side 188 (N-MDSTT-2 in Table 3A) shows the first and second blocking junctions, 138 and 146, in this case partially defining the negative I-V characteristics 474 in FIG. 23. The I-V characteristics of this device for the negative voltage shows conduction at about −10 V, associated with conduction in junction 194 and sub-section 186, until about 4 Amp (472), condition for which the sub-section 188 triggers and goes to a low voltage-high conductivity state. For positive and negative on-states, the asymmetric embodiment can sustain over 60 A of ESD current in a 200 μm-width five-finger device. The unique characteristics of this composite device allows for high ESD protection where the trigger current is required to be relatively high. In this embodiment, the holding currents can be greater than ±2 A. The DC measurements and ESD performance of this device are summarized in Table 1.

In general, custom combinations of symmetric and asymmetric I-V characteristics aimed to ESD protection or specialized circuit applications can be obtained within the scope of the invention in either very advanced or traditional semiconductor technologies for digital circuits, mixed-signal, SoC (System on-a Chip) applications, and smart power electronics. Layout engineers with the required expertise in semiconductor devices and circuit design can implement and integrate any customized symmetric or asymmetric ESD protection by following the layout embodiment top-views depicted in, for example, FIGS. 24A, 24B, and 25A-25D.

Figure 24A:
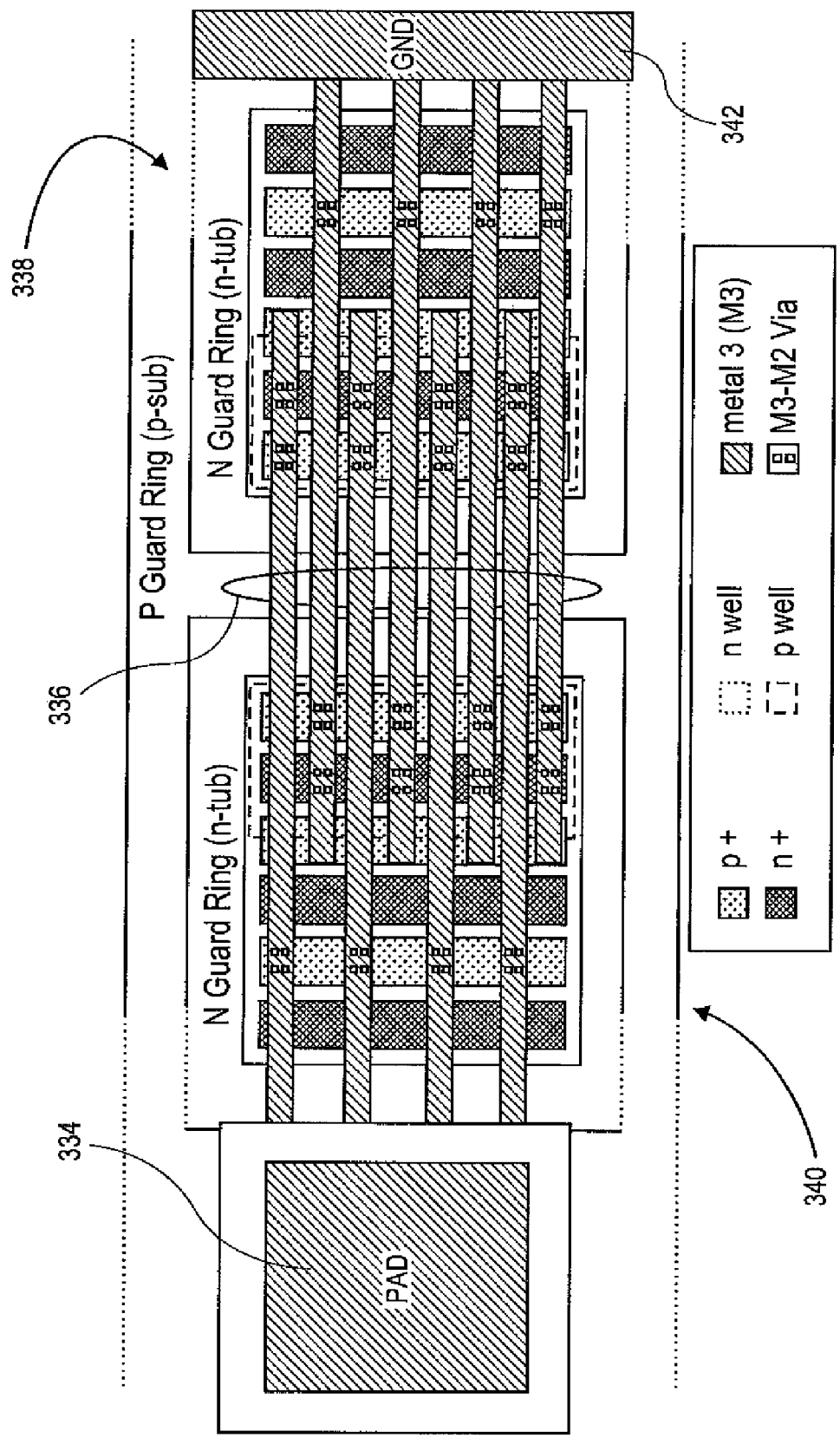
FIGS. 24A and 24B show two layout top views for the DP-STT according to an embodiment of the invention.
Figure 24B:
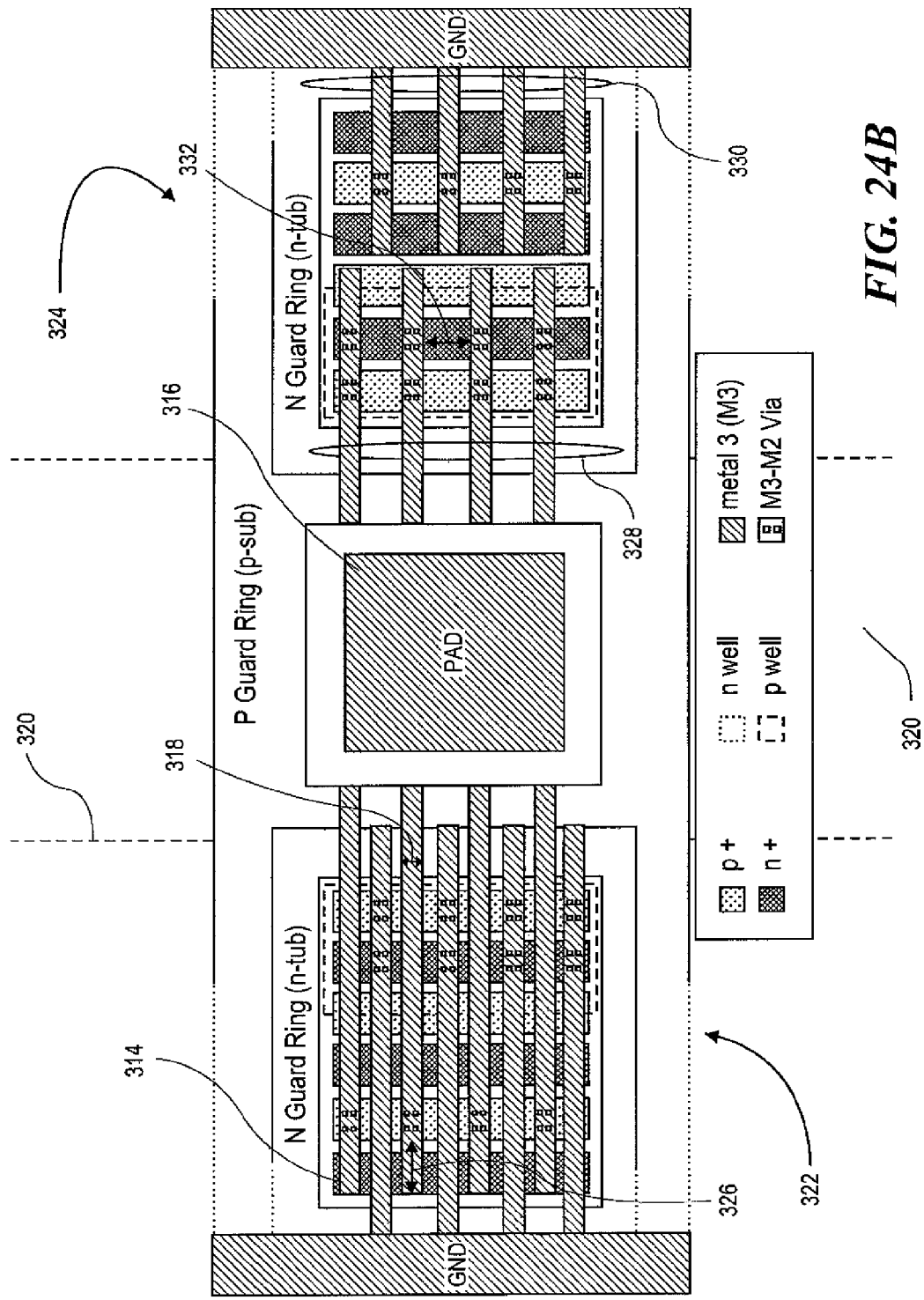

FIGS. 24A and 24B show alternative embodiments for the PAD to GND layout array and device interconnections, using for ease of understanding, the top-view of DP-STT with subsections formed by p-type MDSTT's depicted in FIG. 8B. FIG. 24A shows a layout embodiment where PAD 334 and ground 342 are defined at the two ends of the DP-STT cell. This particular design can be applicable when the PAD position can be defined toward the center of the chip. One connection, the ground, is defined in the periphery of the chip, which facilitates the layout. The interdigitated metal lines 336 are connected to the first 340 and second 338 sub-sections of the DP-STT following the criteria described in the previous embodiments. The device implemented to generate the I-V characteristics previously shown in FIG. 18 follows the layout scheme presented in FIG. 24A, where 340 corresponds to one sub-section and 338 to the other.

FIG. 24B shows a dual-ground rail to single PAD 316 interconnection, with 324 and 322 corresponding to the subsections of the DP-STT, and 320 indicating the area for adjacent circuitry. This PAD interconnection can be necessary when the I/O of the circuit is placed very close to the periphery of the chip, for instance due to design rules or due to packaging considerations.

According to various embodiments, the number of interdigitated metal lines should be even, with half of them connected to the PAD (328, 314) and the other half connected to ground 330. The distance between metal lines 332 and the width of each metal line can be adjusted to minimize the inter-finger resistance without causing current crowding associated with high current density in the metal lines. The minimum metal width 318 considered in this layout is 20 μm and metal lines should be properly spaced following technology ground rules. In general, self-heating in metal lines closer to vias and contacts induces failure at high ESD current due to hot spot generation and metal electromigration. This effect is reduced by properly extending the top layer of metal line 326 over the vias.

Figure 25A:
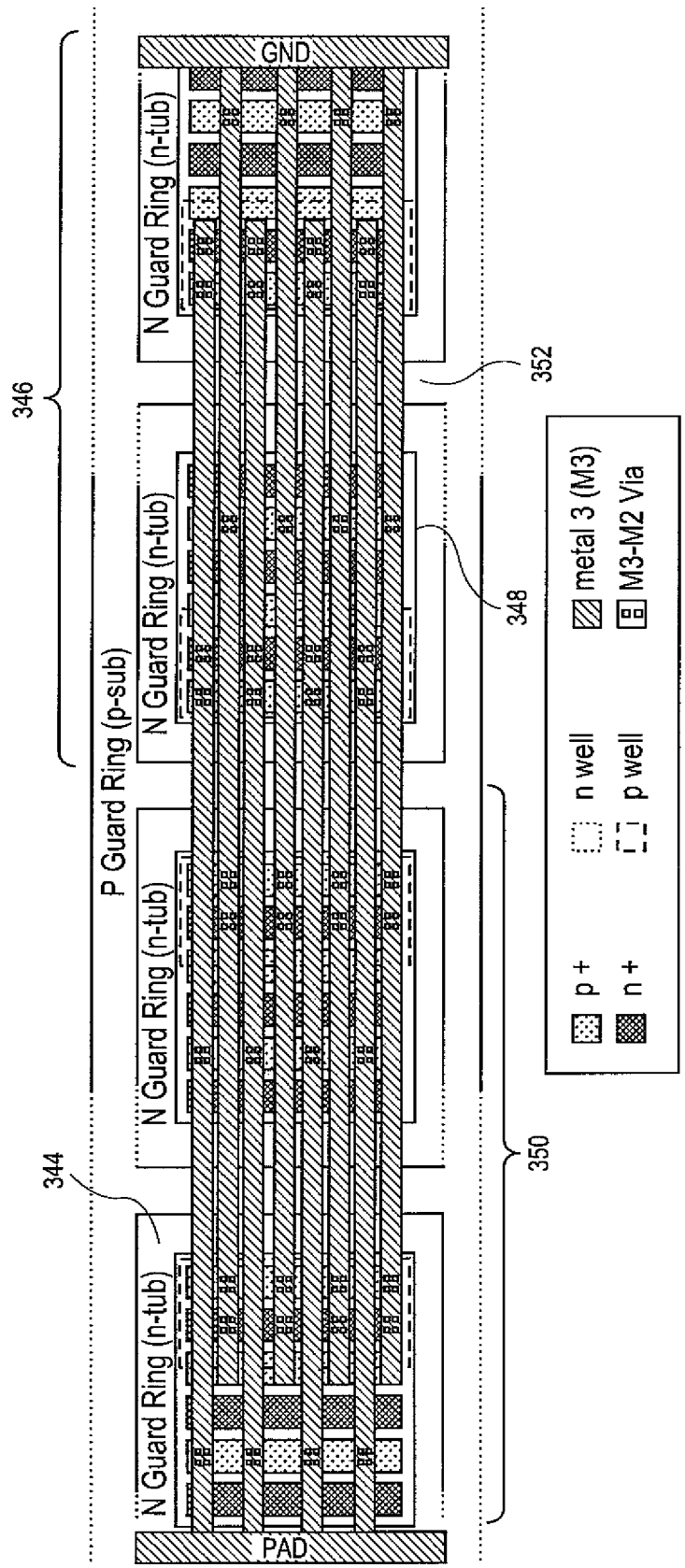
FIGS. 25A, 25B, 25C, and 25D are four layout top views of inter-finger arrays for the DP-STT according to an embodiment of the invention.

FIGS. 25A-25D show layout top-views for customized inter-finger arrays. FIG. 25A shows a DP-STT where two sub-sections are identified by 350 and 346, with 350 for pad to ground ESD protection and 346 for ground to pad ESD protection. In this embodiment, intermediate guard rings 352 separate each sub-cell's (348) N-Tub (344). This array allows for inter-finger isolation but extra area is needed for the inter-finger guard rings. The multifinger layout scheme in FIG. 25A has been previously referenced as the layout with inter-finger guard ring isolation. It has been used in the five-finger devices designed to generate the I-V characteristics previously depicted in FIGS. 15, 20, and 23.

Figure 25B:
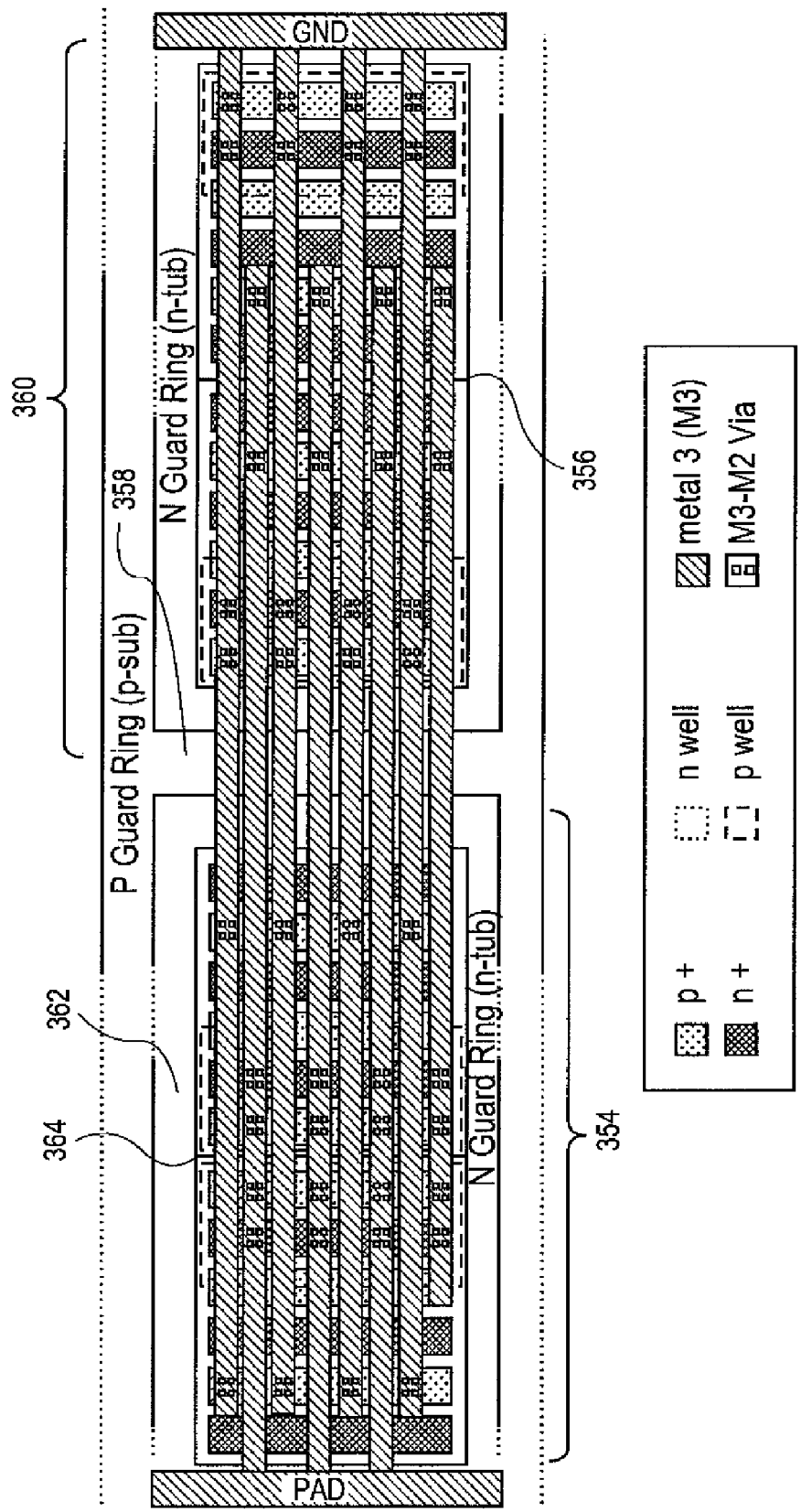

FIG. 25B shows a second embodiment for the inter-finger layout, with each sub-section defined by 360 and 354, and each sub-section using separated guard-ring 358. In this case, each N-Tub is common for all the fingers forming the respective sub-sections 362. Within each section the fingers next to each other can be flipped, so that the vias connected to a specific pad are adjacent, 364 and 356. This assures that the current will take the right conduction path and that no undesirable leakage is obtained between adjacent sub-cell's fingers.

Figure 25C:
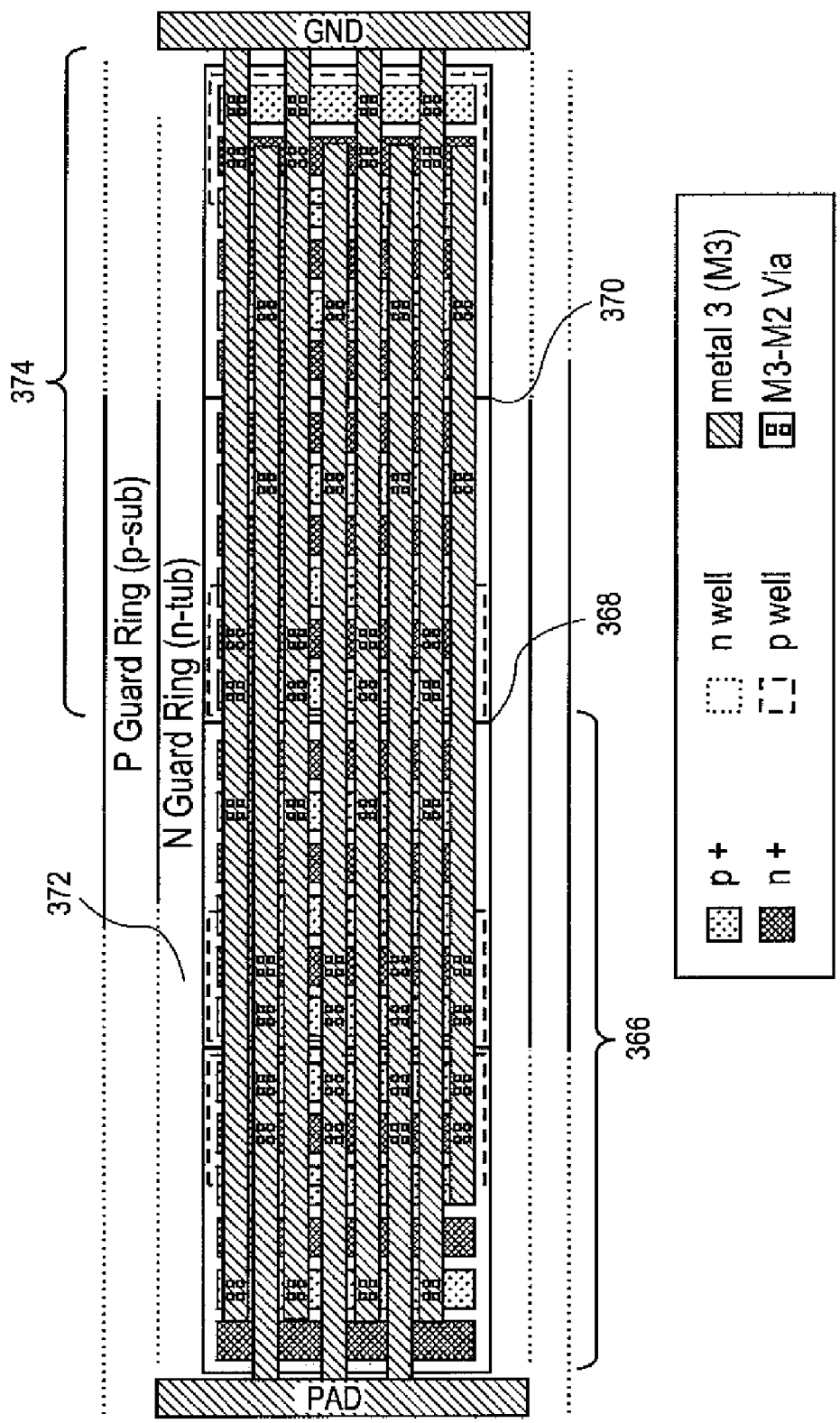
Figure 25D:
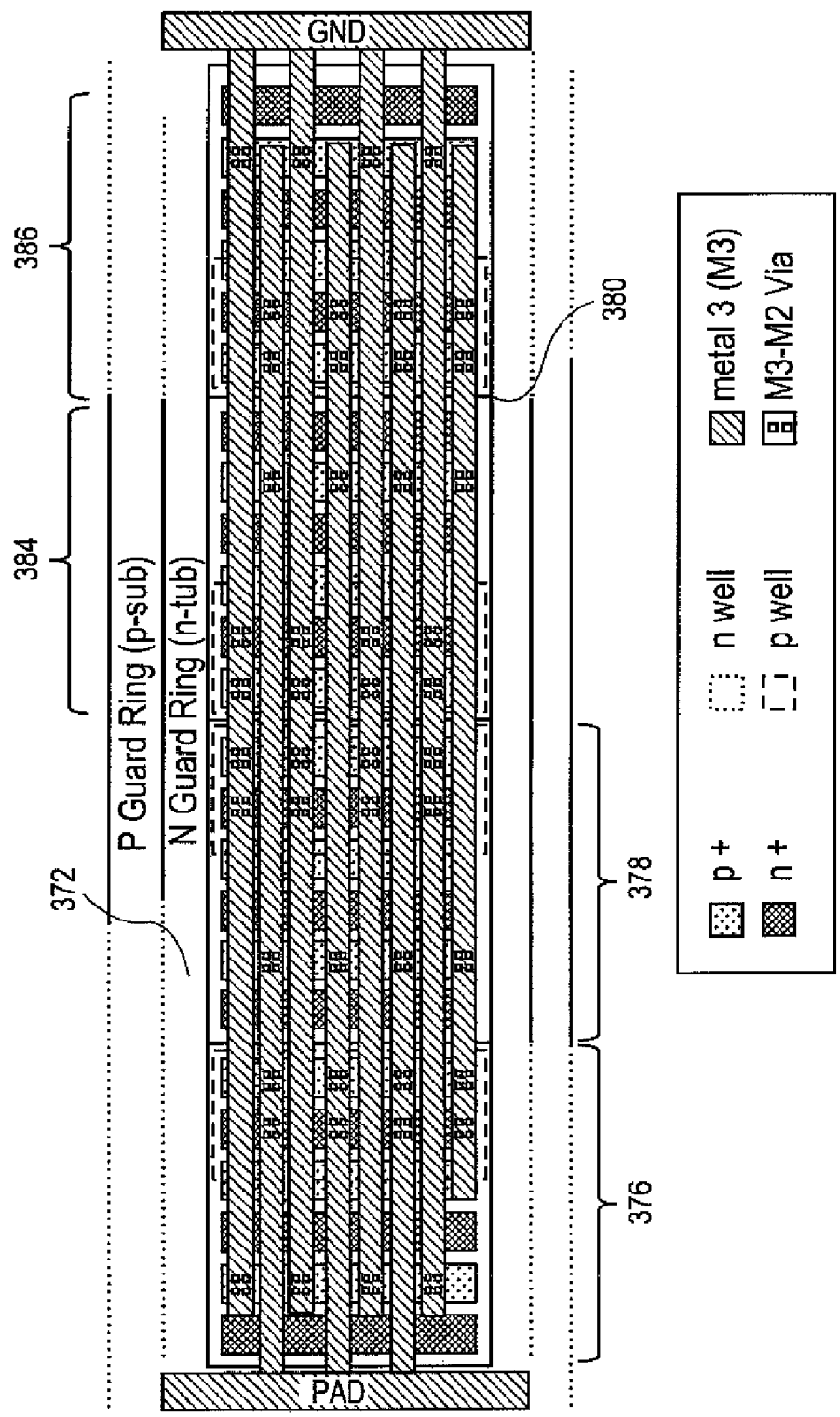

FIGS. 25C and 25D show the inter-finger layout with common N-Tub 372 for all the sub-sections of the DP-STT. In these embodiments, there is no inter-finger isolation and less area is occupied by the protection device. FIG. 22C groups the two sub-sections of the device in 366 and 374, following similar criteria to the ones in FIG. 22B, but in this case, 368 can be a common node and all the adjacent vias in the intermediate region between fingers can be connected to the same pad. Otherwise undesirable interaction between adjacent sub-cells' parasitic devices will affect the performance of the DP-STT.

For the embodiment in FIG. 25D, the sub-sections of the devices are no longer grouped, but distributed, with 376 and 386 for the ground to PAD ESD protection and with 384 and 378 for the pad to ground ESD protection. As observed in the embodiment, customized positioning of the fingers can be defined by the layout engineers to take advantage of this layout design 380, 382, which is found very convenient for the applications that require different numbers of fingers for the ESD protection in one of the directions.

Figure 26:
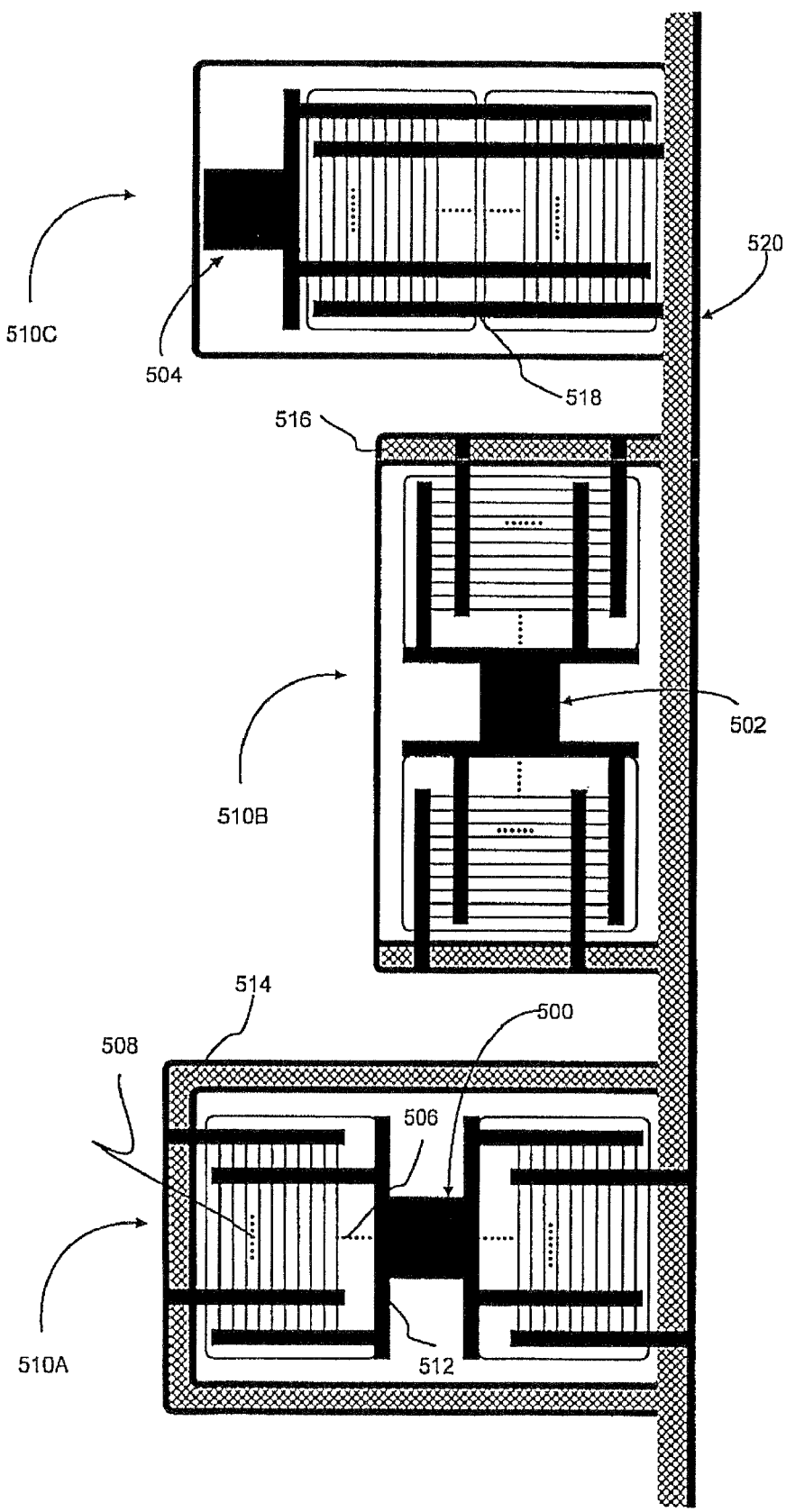
FIG. 26 shows three design-adapted pads to $V_{SS}$ layout schemes for the DP-STT ESD protection cells according to an embodiment of the invention.

The previous layout embodiments (24A, 24B, and 25A-25D) are compared in FIG. 26, using as a reference the common ground rail 520 defined at the periphery of the ICs. FIG. 24B can be implemented following the schemes in 51A and 510B shown in FIG. 26 and FIG. 24A can be implemented following scheme in 510C also shown in FIG. 26. Besides the PAD region, the multifinger array that can be implemented following any of the alternative schemes in FIG. 25 are indicated with dots 506. Selections of these arrays can depend on area and circuit layout constraints. The number of metal lines (508, 518) and device fingers 506 is defined by the level of ESD stress that the devices should sustain. A difference in these embodiments is the layout of the ground metal lines and the distance between the PAD (500, 502, and 504) and the ground rail at the periphery of the chip (514, 516, and 520). Even though these designs have shown to be effective for implementing the DP-STT, in one embodiment it is the one in 510C, because it does not need additional wide ground lines going into the circuit. But for some applications, the distance allowed between the ground rail and the pads may require the use of more stringent layout schemes 510A or 510B.

Figure 27:
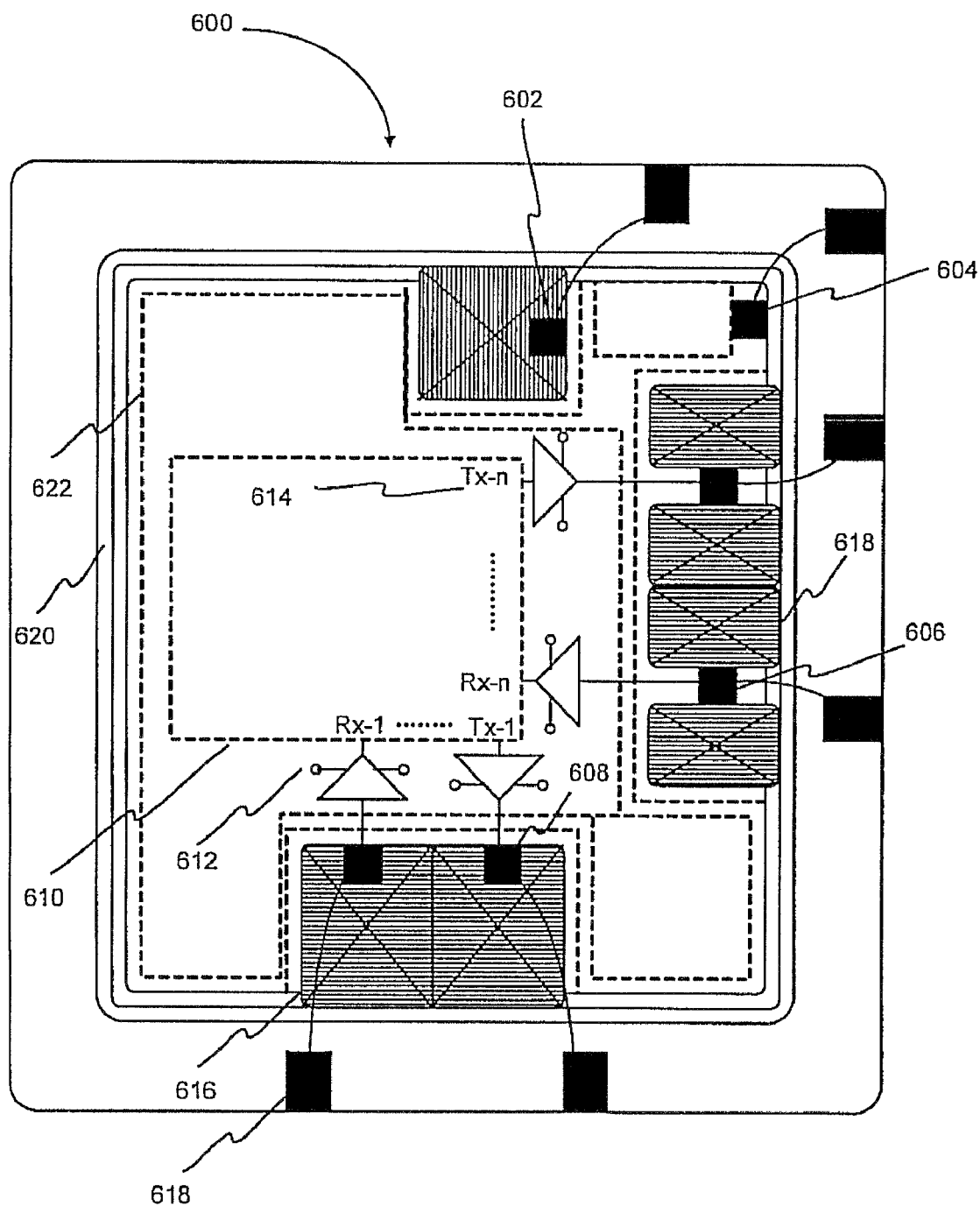
FIG. 27 shows DP-STT pads array in the area designed for the ESD protection within the circuit scribes and low resistance ground rail according to an embodiment of the invention. In this case, the final integration of ESD protection can be used for a high data rate communication transceiver, but it is not limited to this application. For example, it can be extended to other ICs applications within the context of the invention.

An example of the previous layout embodiments on a chip is shown in FIG. 27. The ESD protection can be placed as shown by 616, 618, and 602. The area occupied by the chip 600 is divided in different sections including the package pads 618, core circuitry area 610, receivers 612, and transmitters 614 interface circuits, ESD protection devices 616, 618 and circuit internal pads 608, 606, and 602. Alternatively, for circuits which are required to operate at large levels of ESD current, a wide ESD ground rail 620 can be use to discharge the ESD current while a second periphery ground rail can be use for the main reference of the core circuit 622. In general, this layout embodiment can be customized for the specific circuit application.

This idea can be extended and elaborated in detail in various embodiments disclosed herein. For example, the devices can provide symmetric and asymmetric conduction characteristics as well as provide high current rating per unit area and the required ESD protection for integrated circuits operating under different environments and interface voltage conditions. The results shown herein of measured devices illustrate these characteristics.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

TABLE 1

| ESD Protection Element | ≈Positive DC Conduction Voltage | ≈Negative DC Conduction Voltage | ≈Leakage at Operating Voltage (nA) | (+) IEC (kV) | (−) IEC (kV) |
|---|---|---|---|---|---|
| (DP-N-MDSTT2) X5 (BD-S1) | 14 V | −14 V | 0.7 @ ±12 V | >15 | >15 |
| (DP-P-MDSTT1) X5 | 25 V | −25 V | 1.5 @ ±15 V | >15 | >15 |
| (DP-P-MDSTT2) X5 (BD-S2) | 32 V | −32 V | 3.5 @ ±15 V | >15 | >15 |
| (DP-P-MDSTT2) X5 (BD-AS1) | 15 V | −10 V | <2 @ (−7 V to 12 V) | >15 | >15 |

TABLE 2A

| | Dimensions (µm) | | | | | | | | | | | | | | | | | |
|---|---|---|---|---|---|---|---|---|---|---|---|---|---|---|---|---|---|---|
| Dev. Name | Rx | D1' | D2 | D3 | D4 | D5 | D6 | D7 | D8 | D9 | t | Dr | Dn | Do | Dp | Dp-base | Dp-well | Dp-ext |
| N-MSSTT-1 | 1.6 | 3 | 0.95 | 1.6 | 1.5 | 1.6 | 1.6 | 0.6 | 0.6 | 1.6 | 0 | 1.6 | 5.6 | 0 | 7.85 | 0 | 7.85 | 0 |
| N-MSSTT-2 | 1.6 | 5 | 0.95 | 1.6 | 2.5 | 1.6 | 1.6 | 0.6 | 0.6 | 1.6 | 0 | 1.6 | 6.6 | 0 | 8.85 | 1.6 | 8.85 | 0 |
| N-MSSTT-3 | 1.6 | 5 | 0.95 | 1.6 | 2.5 | 1.6 | 1.6 | 0.6 | 0.6 | 1.6 | 0 | 1.6 | 6.6 | 3.0 | 8.85 | 1.6 | 3.5 | 5.85 |

TABLE 2B

| | Dimensions (µm) | | | | | | | | | | | | | | | | | |
|---|---|---|---|---|---|---|---|---|---|---|---|---|---|---|---|---|---|---|
| Dev. Name | Rx | D1' | D2 | D3 | D4 | D5 | D6 | D7 | D8 | D9 | t | Dr | Dn | Do | Dp | Dp-base | Dn-well | Dn-ext |
| P-MSSTT-1 | 1.6 | 5 | 0.95 | 1.6 | 2.5 | 1.6 | 1.6 | 0.6 | 0.6 | 1.6 | 0 | 1.6 | 9.15 | 0 | 6.3 | 1.6 | 9.15 | 9.15 |
| P-MSSTT-2 | 1.6 | 6.4 | 0.95 | 1.6 | 3.2 | 1.6 | 1.6 | 0.6 | 0.6 | 1.6 | 0 | 1.6 | 9.85 | 0 | 7 | 0 | 0 | 9.85 |
| P-MSSTT-3 | 1.6 | 5 | 0.95 | 1.6 | 2.5 | 1.6 | 1.6 | 0.6 | 0.6 | 1.6 | 0 | 1.6 | 9.15 | 2.5 | 6.3 | 1.6 | 3.5 | 6.65 |

TABLE 3A

| | Dimensions (µm) | | | | | | | | | | | | | | | | | |
|---|---|---|---|---|---|---|---|---|---|---|---|---|---|---|---|---|---|---|
| Dev. Name | Rx | D1 | D2 | D3 | D4 | D5 | D6 | D7 | D8 | D9 | t | Dr | Dn/Dn-ext/Nn-well | Do | Dp | Dp-base | Dp-well | Dp-ext |
| N-MDSTT-1 | 1.6 | 4.8 | 0.95 | 1.6 | 3.2 | 1.6 | 1.6 | 0.6 | 0.6 | 1.6 | 0 | 1.6 | 7.95/7.95 | 0 | 9.2 | 0 | 8.9 | 0 |
| N-MDSTT-2 | 1.6 | 4.8 | 0.95 | 1.6 | 3.2 | 1.6 | 1.6 | 0.6 | 0.6 | 1.6 | 0 | 1.6 | 7.95/0 | 0 | 9.2 | 1.6 | 8.9 | 0 |
| N-MDSTT-3 | 1.6 | 6.4 | 0.95 | 1.6 | 3.2 | 1.6 | 1.6 | 0.6 | 0.6 | 1.6 | 0 | 1.6 | 7.95/0/7.95 | 0 | 10.8 | 1.6 | 8.9 | 0 |
| N-MDSTT-4 | 1.6 | 3.2 | 0.95 | 1.6 | 1.6 | 1.6 | 1.6 | 0.6 | 0.6 | 1.6 | 0 | 1.6 | 6.35/0 | 0 | 9.2 | 1.6 | 8.9 | 0 |

TABLE 3B

| | Dimensions (µm) | | | | | | | | | | | | | | | | | |
|---|---|---|---|---|---|---|---|---|---|---|---|---|---|---|---|---|---|---|
| Dev. Name | Rx | D1 | D2 | D3 | D4 | D5 | D6 | D7 | D8 | D9 | t | Dr | Dn | Do | Dp | Dp-base | Dn-well | Dn-ext |
| P-MDSTT-1 | 1.6 | 3.2 | 0.95 | 1.6 | 1.6 | 1.6 | 1.6 | 0.6 | 0.6 | 1.6 | 0 | 1.6 | 8.9 | 0 | 6.35 | 1.6 | 0 | 8.9 |
| P-MDSTT-2 | 1.6 | 3.2 | 0.95 | 1.6 | 1.6 | 1.6 | 1.6 | 0.6 | 0.6 | 1.6 | 0 | 1.6 | 8.9 | 0 | 6.35 | 1.6 | 0 | 0 |
| P-MDSTT-3 | 1.6 | 4.8 | 0.95 | 1.6 | 1.6 | 1.6 | 1.6 | 0.6 | 0.6 | 1.6 | 0 | 1.6 | 10.5 | 10.5 | 6.35 | 1.6 | 4.5 | 0 |

What is claimed is:

1. A method of making a semiconductor device, the method comprising:
   forming a substrate of a first conductivity type;
   forming a first section in the substrate;
   forming a first electrode electrically contacting a first region doped to the first conductivity type in the first section;
   forming a second electrode electrically contacting a second region doped to a second conductivity type in the first section, wherein the first region and the second region are disposed adjacent to each other;
   forming a first forward blocking junction formed in a current path between the first electrode and the second electrode, wherein the current path between the first electrode and the second electrode comprises one of a P-N-P-N structure and an N-P-N-P structure; and
   forming a first reverse blocking junction formed in a current path between the second electrode and an edge of the first section.

2. The method of making a semiconductor device according to claim 1, wherein the first forward blocking junction comprises a first sub-region formed at a junction between the first region and the second region.

3. The method of making a semiconductor device according to claim 2, wherein the first sub-region comprises one of net doping of the first conductivity type, net doping of the second conductivity type, or an isolation area.

4. The method of making a semiconductor device according to claim 3 further comprising:
   forming a second sub-region doped to the second conductivity type in the second region.

5. The method of making a semiconductor device according to claim 3 further comprising:
   forming a second sub-region doped to the first conductivity type in the first region.

6. The method of making a semiconductor device according to claim 4, wherein the second sub-region is separated from the first sub-region by a predetermined distance.

7. The method of making a semiconductor device according to claim 5, wherein the second sub-region is separated from the first sub-region by a predetermined distance.

8. The method of making a semiconductor device according to claim 7, wherein the device sub-regions are combined in an interdigitated/multifinger layout array for a predetermined power capability.

* * * * *